US008848337B2

(12) United States Patent
Keane et al.

(10) Patent No.: US 8,848,337 B2
(45) Date of Patent: Sep. 30, 2014

(54) SIGNAL PROCESSING DEVICES HAVING ONE OR MORE MEMRISTORS

(75) Inventors: Martin Anthony Keane, Chicago, IL (US); John R. Koza, Los Altos Hills, CA (US); Matthew John Streeter, Pittsburgh, PA (US)

(73) Assignee: John R. Koza, Los Altos Hills, CA (US)

( * ) Notice: Subject to any disclaimer, the term of this patent is extended or adjusted under 35 U.S.C. 154(b) by 784 days.

(21) Appl. No.: 13/018,839

(22) Filed: Feb. 1, 2011

(65) Prior Publication Data

US 2012/0194967 A1    Aug. 2, 2012

(51) Int. Cl.
H01L 45/00    (2006.01)
H01C 13/00    (2006.01)

(52) U.S. Cl.
CPC ..................... H01C 13/00 (2013.01)
USPC ...................................... 361/437

(58) Field of Classification Search
USPC ...................................... 361/437
See application file for complete search history.

(56) References Cited

U.S. PATENT DOCUMENTS

| 1,538,964 | A | 5/1925 | Zobel |
| 2,663,806 | A | 12/1953 | Darlington |
| 6,225,859 | B1 | 5/2001 | Irvine et al. |
| 8,081,129 | B1 * | 12/2011 | Santori et al. ............... 343/749 |
| 8,212,621 | B2 * | 7/2012 | Strachan et al. ............ 331/2 |
| 8,249,838 | B2 * | 8/2012 | Pino et al. ................. 703/2 |
| 8,274,312 | B2 * | 9/2012 | Pino et al. ................. 326/104 |
| 8,433,665 | B2 * | 4/2013 | Tang et al. ................. 706/33 |
| 2008/0014750 | A1 | 1/2008 | Nagashima |
| 2008/0079029 | A1 | 4/2008 | Williams |
| 2008/0090337 | A1 | 4/2008 | Williams |
| 2008/0149907 | A1 | 6/2008 | Hsu |
| 2009/0095985 | A1 | 4/2009 | Lee |
| 2011/0017977 | A1 | 1/2011 | Bratkovski |
| 2011/0069529 | A1 * | 3/2011 | Srinivasan et al. ............ 365/148 |
| 2011/0119036 | A1 * | 5/2011 | Pino et al. ............ 703/2 |
| 2011/0204310 | A1 * | 8/2011 | Strachan et al. ............ 257/2 |
| 2011/0226066 | A1 * | 9/2011 | Anand et al. ............ 73/777 |
| 2012/0105143 | A1 * | 5/2012 | Strachan et al. ............ 327/553 |
| 2012/0217994 | A1 * | 8/2012 | Pino et al. ............ 326/38 |
| 2012/0218810 | A1 * | 8/2012 | Srinivasan et al. ............ 365/148 |
| 2013/0130261 | A1 * | 5/2013 | Prodromakis et al. ....... 435/6.11 |
| 2013/0218815 | A1 * | 8/2013 | Nugent ............ 706/12 |

FOREIGN PATENT DOCUMENTS

| WO | WO2008/108822 | 9/2008 |
| WO | WO2009/075694 | 6/2009 |
| WO | WO2010-087852 | 8/2010 |

OTHER PUBLICATIONS

A Memristor Based All-Analog UWB Receiver. Matthias Leeb, Feb. 21, 2012.*
Memristor I Learn everything there is to know about Memristor at Reference.com. May 26, 2012.*

(Continued)

Primary Examiner — Ronald W Leja
(74) Attorney, Agent, or Firm — Blakely, Sokoloff, Taylor & Zafman LLP

(57) ABSTRACT

Signal-processing devices having memristors are described for performing frequency-discrimination functions, amplitude-discrimination functions, and time-oriented functions. In each case, the time-domain behavior of the memristors described herein enables these functions to be performed. In one embodiment, memristance of an arrangement of memristors of a device is, after an initial transitional period, predominantly at a first level if frequency of an input signal of the device is less than a first frequency and predominantly at a second level if the frequency of the input signal is greater than a second frequency.

40 Claims, 19 Drawing Sheets

(56) References Cited

OTHER PUBLICATIONS

Signal Processing and Speech communication Laboratory; "Memristor Emulation for Signal Processing Applications"; Matthias Leeb. Jan. 14, 2011.*

SpringerLink; "Proposal for Memristors in Signal Processing"; B. Mouttet. Abstract; No month 2009.*

Zdeněk Biolek et al., "SPICE Model of Memristor with Nonlinear Dopant Drift", Radio Engineering vol. 18, No. 2, pp. 210-214, Jun. 2009.

Leon O. Chua, "Memristor-The Missing Circuit Element", IEEE Transactions on Circuits Theory, vol. 18, No. 5, pp. 507-519, Sep. 1971.

Leon O. Chua et al., "Memristive Devices and Systems", Proceedings of the IEEE, vol. 64, No. 2, pp. 209-223, Feb. 1976.

Massimiliano Di Ventra et al., "Circuit Elements with Memory: memristors, memcapacitors and meminductors", arXiv:0901.3682v1 [cond-mat.mes-hall], pp. 1-6, Jan. 23, 2009.

Fortuna, Luigi et al., Chua's Circuit Implementations: Yesterday, Today and Tomorrow, Hackensack, NJ: World Scientific, 2009.

Yogesh N. Joglekar et al., "The Elusive Memristor: Properties of Basic Electrical Circuits", European Journal of Physics, vol. 30, pp. 661-675, 2009.

Neil D. Mathur, "The Fourth Circuit Element", Nature, vol. 453, pp. E13, Oct. 30, 2008.

Yuriy V. Pershin et al., "Practical Approach to Programmable Analog Circuits with Memristors", arXiv:0908.3162v1, [physics.ins-det], pp. 1-7, Aug. 21, 2009.

Thomas Quarles et al., "SPICE 3 Version 3F5 User's Manual", Department of Electrical Engineering and Computer Science, University of California. Berkeley, CA, Mar. 1994.

Dmitri B. Stukov et al., "The Missing Memristor Found", Nature, vol. 453, doi:10.1038/nature06932, pp. 80-83, May 1, 2008.

Dmitri B. Stukov et al., "The Missing Memristor Found", Nature, vol. 459, Corrections and Amendments pp. 1154, Jun. 25, 2009.

James M. Tour et al., "The Fourth Element", Nature, vol. 453, pp. 42-43, May 1, 2008.

R. Stanley Williams, "How We Found the Missing Memristor", IEEE Spectrum, pp. 28-35, Dec. 2008.

Weidong Wang et al., "Study of Filter Characteristics Based on PWL Memristor", 978-1-4244-4888-3/09, © 2009 IEEE, pp. 969-973, 2009.

Wikipedia, "Memristor", http://en.wikipedia.org/wiki/Memristor, pp. 1-7, printed Sep. 23, 2009.

Bo-Cheng Bao et al, "Initial State Dependent Dynamical Behaviors in a Memristor Based Chaotic Circuit", Chinese Physical Society and IOP Publishing Ltd., vol. 27, No. 7, 2pages, Dec. 29, 2009.

Blaise Mouttet, "Memristive Transfer Matrices", http://adsabs.harvard.edu/abs/2010arXiv1004.0041M, 6 pages, Mar. 2010.

Farnood Merrikh-Bayat et al, "Memristor-based circuits for performing basic arithmetic operations", http://www.sciencedirect.com/science/article/pii/S1877050910003972, 5 pages, Feb. 22, 2011.

International Search Report of International Application No. PCT/US2012/021024 mailed May 25, 2012, 3 pages.

Written Opinion of the International Searching Authority of International Application No. PCT/US2012/021024 mailed May 25, 2012, 5 pages.

International Preliminary Report on Patentability of International Application No. PCT/US2012/021024 mailed Aug. 6, 2013, 6 pages.

* cited by examiner

SIGNAL PROCESSING DEVICES HAVING ONE OR MORE MEMRISTORS

TECHNICAL FIELD

Embodiments of the invention relate to the field of analog electrical circuits. More particularly, the present invention relates to devices containing an arrangement of memristors that is capable of performing frequency-discrimination functions, amplitude-discrimination functions, and time-oriented functions.

BACKGROUND

Analog electrical circuit theory provides mathematical relationships between voltage v, current i, charge q, and magnetic flux φ.

There are six unordered pairs that may be selected from this set of four variables. The well-known electrical properties of the most familiar passive elements (namely resistors, inductors, and capacitors) provide relationships between three of these six pairs of variables.

For example, an ideal resistor with resistance R is a two-terminal passive circuit element defined by the relationship between voltage v(t) and current i(t):

$$dv = Rdi.$$

An ideal inductor with inductance L is a two-terminal passive circuit element defined by the relationship between flux φ(t) and current i(t):

$$d\phi = Ldi.$$

An ideal capacitor with capacitance C is a two-terminal passive circuit element defined by the relationship between charge q(t) and voltage v(t):

$$dq = Cdv.$$

A fourth of the six possible relationships is provided by the definition of charge q(t) (as the time integral of current):

$$dq = idt.$$

In addition, a fifth relationship is provided by the definition of flux φ(t) (as the time integral of voltage):

$$d\phi = vdt.$$

In a 1971 paper entitled "The Missing Circuit Element" (Chua 1971), Leon Chua of the University of California at Berkeley hypothesized the existence of a fourth two-terminal passive circuit element defined by the relationship between flux φ(t) and charge q(t):

$$d\phi = M(q)dq.$$

Chua demonstrated that no combination of the three most familiar passive electrical elements (resistors, inductors, and capacitors) could duplicate the function of this hypothesized fourth passive circuit element. Chua gave the name "memristor" to this circuit element. A memristor's memristance, M(q), is a function of charge Like resistance, memristance is measured in Ohms.

Because no physical realization of Chua's hypothesized circuit element as a single passive component existed in 1971, experiments involving the behavior of memristors were conducted, for a number of years, by emulating the memristor by rather complex and impractical arrangements of active elements (using, in one instance, 15 transistors along with additional passive circuit elements).

In a 2008 article in Nature entitled "The Missing Memristor Found," (hereinafter "Strukov Article") Dmitri B. Strukov, Gregory S. Snider, Duncan R. Stewart, and R. Stanley Williams of HP Labs announced the development of a physical prototype of a memristor as a passive component. HP Labs' memristor is a nanoscale device with layers of titanium-dioxide and platinum.

The characteristics of HP Labs' memristor are described as follows. First, memristors are passive devices. Second, memristance is a continuous analog quantity that changes as a function of the time integral of the current that has passed through the memristor. Third, the memristor retains the analog value of this time integral even when no current is flowing. Indeed, the name "memristor" (short for "memory resistor") reflects the fact that the memristor is a non-volatile memory device. Thus, memristors may be used to store analog information. Fourth, when a certain amount of current has passed through the memristor in a particular direction, the memristor ceases to further integrate current in that direction. Thus, memristors have a maximum-resistance "off" state and a minimum-resistance "on" state (permitting them to be used to store binary digital information). In the memristor developed by HP Labs, the time integration of current ceases because dopants can no longer move. Fifth, the memristor's continuous analog behavior resembles that of neural synapses and other processes known to exist in nature. Sixth, memristors are two-terminal devices.

FIG. 1 shows a schematic of a single memristor M 100. In the present disclosure, we adopt the convention of using the term "positive terminal" to refer to the terminal 110 which, when a positive current flows through the memristor in the direction from the terminal designated as the positive terminal to the memristor's other terminal (i.e., its negative terminal 120), the doped, low resistance portion 250 of FIG. 2 increases and thus memristance moves toward its low-end value of $R_{ON}$.

FIG. 2 illustrates the memristor developed by HP Labs. A semiconductor film of thickness D 230 is sandwiched between platinum contact 201 (associated with terminal 200) and platinum contact 211 (associated with terminal 210). The memristor's memristance depends on the concentration of dopants (e.g., positive ions) between the two metal contacts. The degree of concentration of dopants in the semiconductor film between the two metal contacts is represented in FIG. 2 as a geographic boundary 270 dividing the semiconductor film into two portions. The memristor's total memristance depends on the location of the boundary 270. The memristor shown in FIG. 2 is in a partially doped state. In particular, the semiconductor film has a first portion 250 (shown to the left side of boundary 270) having a high concentration of dopants and, therefore, low resistance. The semiconductor film has a second portion 260 (to the right of boundary 270) having a low (essentially zero) dopant concentration and appreciably higher resistance. The quantities w 220 and D–w 280 indicate the location of the boundary in FIG. 2. The fraction of the memristor that is doped is w/D, and the fraction of the memristor that is undoped is [D–w]/D. If boundary 270 is at the far left of FIG. 1 (i.e., the device is in the totally undoped state), the resistance of the device is at its maximal value $R_{OFF}$. If boundary 270 is at the far right, the resistance of the device is at its minimal value $R_{ON}$. In practice, $R_{ON} \ll R_{OFF}$. The memristance of the device, M(w), at a particular time t depends on the changing value of w(t), and is as follows:

$$M(w(t)) = R_{ON}\frac{w(t)}{D} + R_{OFF}\left(1 - \frac{w(t)}{D}\right).$$

A difference in voltage v(t) between the voltage at terminal 200 and the voltage at terminal 210 causes a current to flow through the memristor. The current flow, in turn, causes dopants to drift. The dopant drift changes w(t) 220, thereby adjusting the boundary 270 in FIG. 2. As explained in the Strukov Article, for the case of ohmic electronic conductance and linear ionic drift in a uniform field with average ion mobility $u_v$, $$v(t) = i(t)\left[R_{ON}\frac{w(t)}{D} + R_{OFF}\left(1 - \frac{w(t)}{D}\right)\right]$$

and $$\frac{dw(t)}{dt} = u_v i(t) R_{ON}/D.$$

Integrating both sides of the previous equation yields $$w(t) = u_v q(t) R_{ON}/D.$$

$$M(q) = R_{OFF}[1 - q(t) u_v R_{ON}/D^2].$$

Based on the above characteristics, memristors have been predicted to find fruitful applications in areas such as ultra-dense non-volatile memory cells, crossbar memory, and logic. Because of the resemblance of the memristor's continuous analog behavior to neural synapses, it has also been predicted that memristors may find applications in the field of analog memories, pattern recognition, and artificial intelligence. Because the memristor is a two-terminal passive device, circuit layout may be made more efficient in certain situations. Because the memristor is a non-volatile memory device, memristors may find many applications where energy usage is important.

Substituting the above equation for w(t) into the above equation for v(t) yields the memristance of the system which, when $R_{ON} \ll R_{OFF}$, simplifies to

SUMMARY OF THE INVENTION

Signal-processing devices are described for performing frequency-discrimination functions, amplitude-discrimination functions, and time-oriented functions. In one embodiment, the memristance of an arrangement of memristors of a device is, after an initial transitional period, predominantly at a first level if the frequency of an input signal of the device is less than a first frequency and predominantly at a second level if the frequency of the input signal is greater than a second frequency. In each case, the time-domain behavior of the arrangement of memristors described herein enables these functions to be performed.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Signal-processing devices are described for performing frequency-discrimination functions. In one embodiment, the memristance of an arrangement of memristors of a device is, after an initial transitional period, predominantly at a first level if the frequency of an input signal of the device is less than a first frequency and predominantly at a second level if the frequency of the input signal is greater than a second frequency.

The signal-processing devices include an arrangement of memristors that is capable of performing frequency-discrimination functions such as those of lowpass, highpass, bandpass, bandstop, crossover, and comb filters; frequency-discrimination functions such as that of a frequency shift key decoder; amplitude-discrimination functions such as that of an amplitude shift key decoder; and time-oriented functions such as those of an oscillator and a monostable multivibrator. In each case, the time-domain behavior of the arrangement of memristors described herein enables these functions to be performed.

In the following description, numerous specific details are set forth, such as specific frequencies, in order to provide a thorough understanding of the present invention. It will be apparent to one skilled in the art, that the present invention may be practiced without these specific details. In other instances, well-known circuit elements are not described in detail in order to not unnecessarily obscure the present embodiments.

Figure 3:
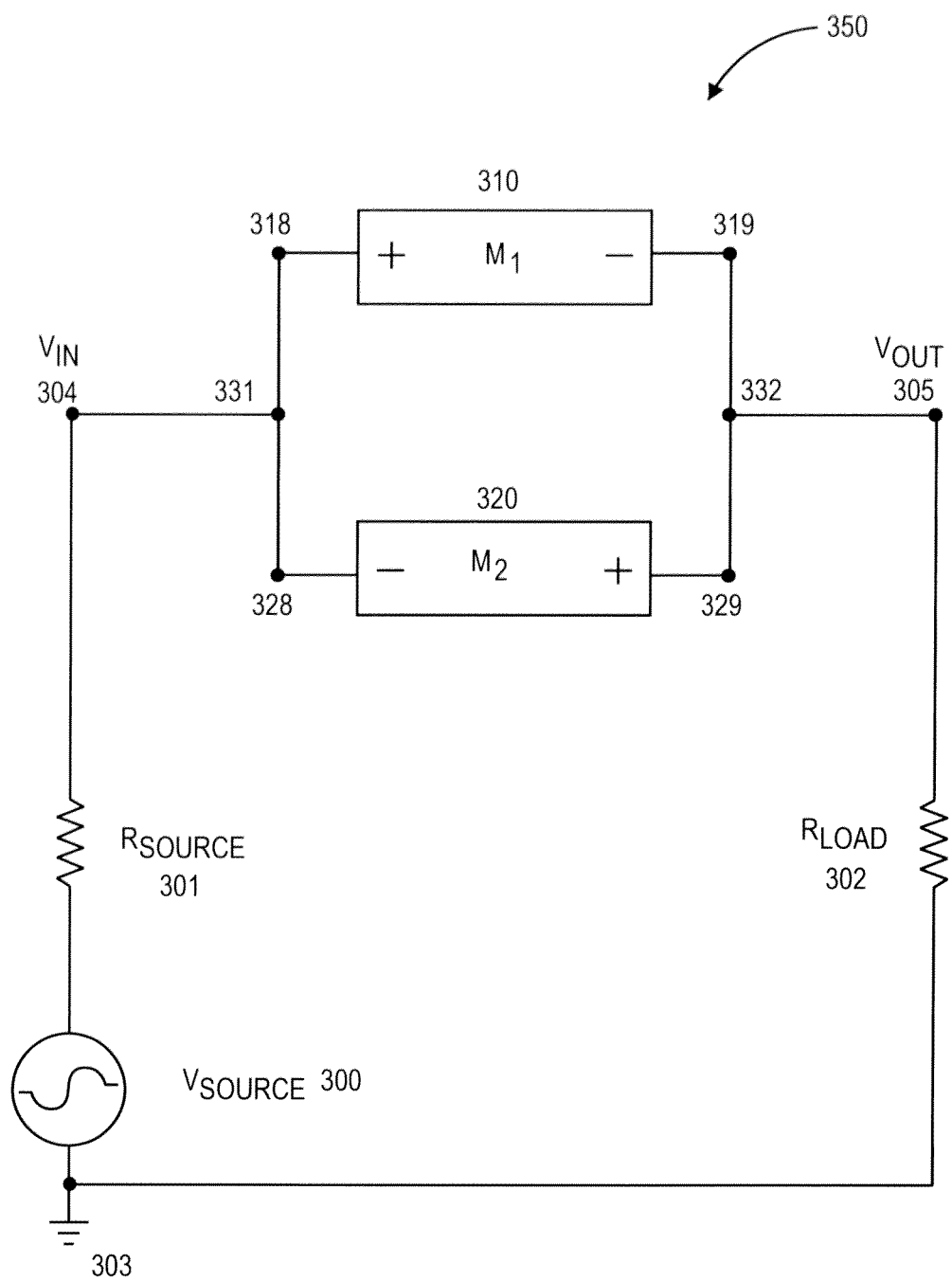
FIG. 3 illustrates a signal-processing device (a lowpass filter circuit) having memristors in accordance with one embodiment.

FIG. 3 illustrates a signal-processing device 350 (a lowpass filter circuit) having memristors in accordance with one embodiment. In this embodiment, an alternating current voltage source VSOURCE 300 supplies a signal through source resistor RSOURCE 301, and the circuit's output terminal (e.g., probe point) VOUT 305 is coupled through load resistor RLOAD 302 to ground 303. In FIG. 3, memristor M1 310 has a positive terminal 318 and a negative terminal 319, and memristor M2 320 has a negative terminal 328 and a positive terminal 329. The positive terminal 318 of the first memristor M1 310 is coupled at connection point 331 to the negative terminal 328 of the second memristor M2 320. The negative terminal 319 of the first memristor M1 310 is coupled at connection point 332 to the positive terminal 329 of the second memristor M2 320. The incoming signal VIN at input terminal VIN 304 is fed to connection point 331. Connection point 332 is coupled to VOUT 305.

In an embodiment, an output amplitude VOUT 305 of the device 350 is, after an initial transitional period, predominantly at a first level if the frequency of the input signal is less than a first frequency and the output amplitude is, after the initial transitional period, predominantly at a second level, if the frequency of the input signal is greater than a second frequency. The second level is substantially lower than the first level of the output amplitude. In this embodiment, the signal-processing device is a lowpass filter circuit.

For purposes of illustrating the operation of one embodiment of the circuit of FIG. 3, the source resistance RSOURCE 301 and load resistance RLOAD 302 are each 100Ω. An alternating current signal of 1 volt RMS (−1.41 to +1.41 volts) is supplied by VSOURCE 300. Memristors M1 310 and M2 320 each have low-end values of memristance, $R_{ON1}$ and $R_{ON2}$, of 100Ω and high-end memristances, $R_{OFF1}$ and $R_{OFF2}$, of 100,000Ω Memristors M1 310 and M2 320 each have values of $10^6$ for $k_1 = u_v/D_1^2$ (where $u_v$ is ion mobility) and $k_2 = u_v/D_2^2$. The units for D are in nanometers; the units for $u_v$ are in $nm^2 volt^{-1} sec^{-1}$; and the units for k are in $volt^{-1} sec^{-1}$.

Table 1 shows the frequency response of the circuit of FIG. 3 to various frequencies between 10 Hz and 10 kHz. Column 1 shows the frequency of the incoming signal VIN at input terminal 304; column 2 shows the RMS value of VOUT in millivolts (mV); and column 3 shows the gain in decibels (dB). The memristor behavior shown in this table was obtained using the SPICE model discussed later in this disclosure. As can be seen in table 1, low frequencies are passed at 333 mV RMS while high frequencies are attenuated by about −40 dB (to about 2 mV RMS). In summary, the circuit of FIG. 3 has the frequency-discrimination capabilities of a lowpass filter.

TABLE 1

Frequency Response of one embodiment of the lowpass filter of FIG. 3

| Frequency (Hz) | VOUT (mV) | Gain (dB) |
| --- | --- | --- |
| 10 | 333.1 | −0.01 |
| 33 | 331.4 | −0.05 |
| 100 | 323.0 | −0.27 |
| 333 | 270.5 | −1.81 |
| 577 | 183.2 | −5.20 |
| 760 | 101.5 | −10.33 |
| 872 | 25.1 | −22.45 |
| 887 | 9.8 | −30.60 |
| 889 | 7.1 | −33.43 |
| 891 | 4.8 | −36.84 |
| 893 | 3.6 | −39.35 |
| 895 | 3.4 | −39.73 |
| 899 | 3.4 | −39.93 |
| 902 | 3.3 | −40.03 |
| 918 | 3.2 | −40.40 |
| 934 | 3.1 | −40.65 |
| 942 | 3.1 | −40.75 |
| 950 | 3.0 | −40.84 |
| 966 | 3.0 | −41.00 |
| 1,000 | 2.9 | −41.28 |
| 3,333 | 2.1 | −43.85 |

Figure 4:
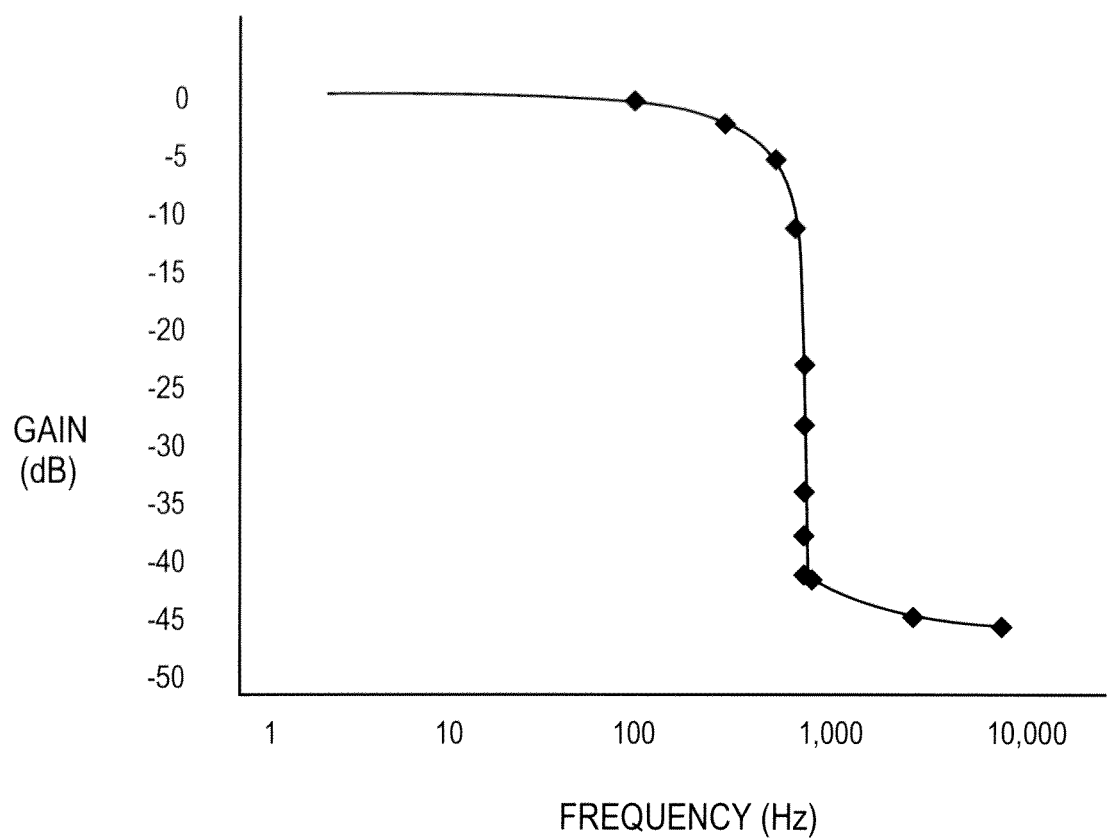
FIG. 4 illustrates the frequency response of the circuit shown in FIG. 3 in accordance with one embodiment.

FIG. 4 graphically illustrates the frequency response of the lowpass circuit of FIG. 3 in accordance with one embodiment.

Figure 5:
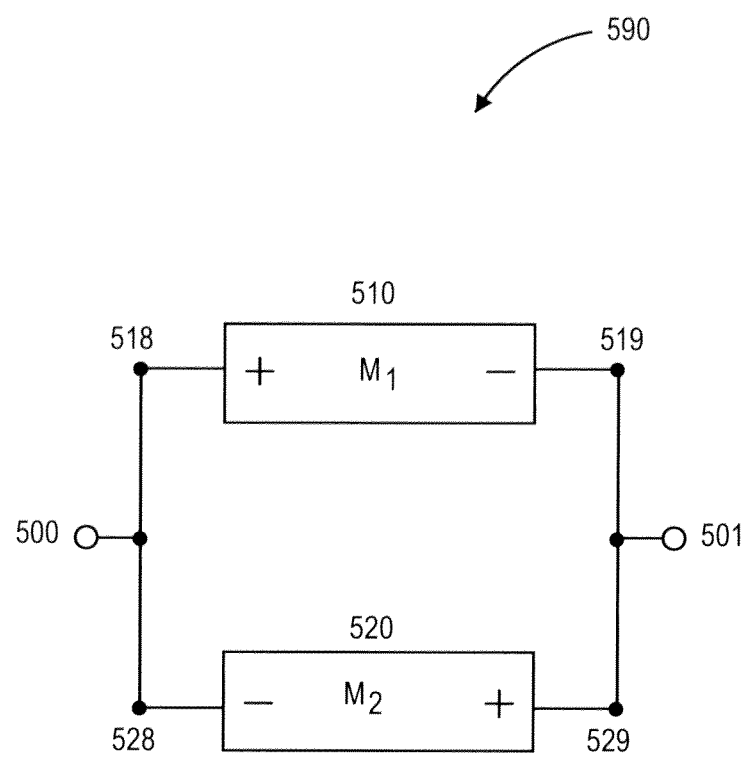
FIG. 5 illustrates a parallel arrangement of memristors discussed herein, in which the positive terminal of a first memristor is connected to the negative terminal of a second memristor and the negative terminal of the first memristor is connected to the positive terminal of the second memristor.

FIG. 5 illustrates a signal-processing device 590 having an arrangement of memristors in accordance with one embodiment. The memristors M1 510 and M2 520 are arranged in a similar manner as the memristors M1 310 and M2 320. The positive terminal 518 of M1 510 is coupled to the negative terminal 528 of M2 520. The negative terminal 519 of M1 510 is coupled to the positive terminal 529 of M2 520.

The frequency-discrimination capabilities of the arrangement of memristors in FIG. 5 and the circuit shown in FIG. 3 arise from the time-domain characteristics of this arrangement of memristors. Specifically, the way that the circuit of FIG. 3 achieves the functionality of a lowpass filter can be appreciated by comparing the memristance $r_1$ of memristor M1 310 and the memristance $r_2$ of memristor M2 320 for a low frequency that lies squarely in the filter's passband with the memristance of M1 and M2 at a high frequency that lies squarely in the filter's stopband.

Figure 1:
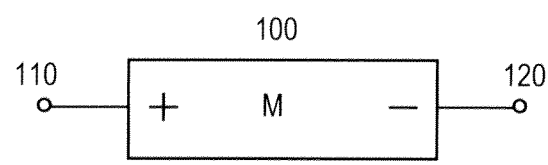
FIG. 1 illustrates a schematic of a single memristor M 100.
Figure 2:
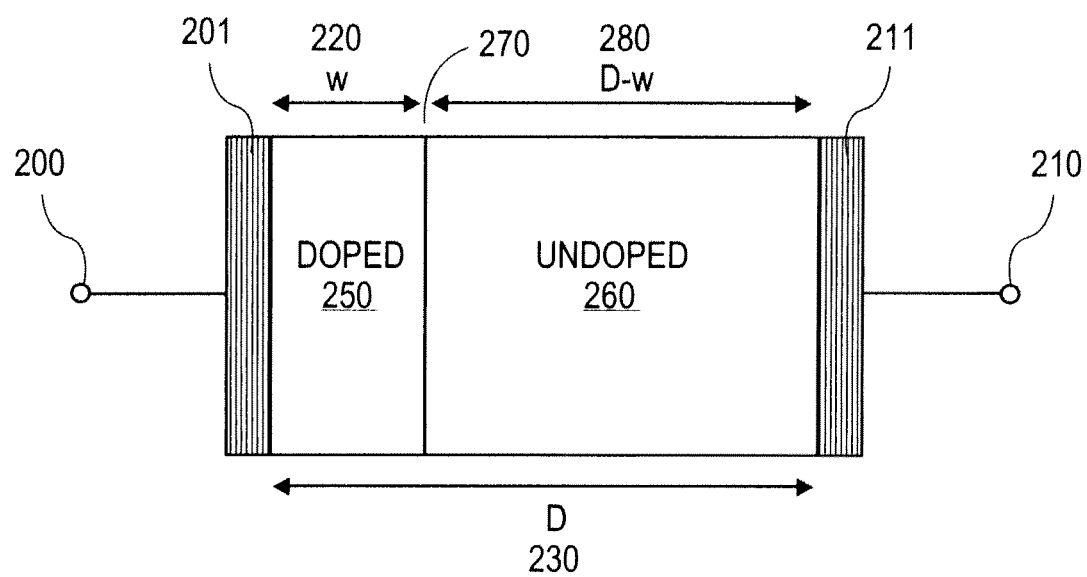
FIG. 2 illustrates the memristor developed by HP Labs.

First, consider a low frequency that is squarely in the passband (e.g., 10 Hz). In one embodiment, voltage VIN at input terminal 304, or simply VIN 304, is positive during the incoming waveform's first half-cycle, thereby causing current to flow through memristor M1 310 from its positive terminal 318 to its negative terminal 319. Assuming that memristor M1 310 initially starts in its OFF state, the flow of current through M1 causes its memristance $r_1$ to start decreasing from 100,000Ω ($R_{OFF}$, its high-end value) toward 100Ω ($R_{ON}$, its low-end value). In this example, it takes 3 milliseconds (ms) for $r_1$ to reach $R_{ON}$. This is the point when D=w (referring to FIG. 2). Once M1's memristance $r_1$ reaches its low-end value, $R_{ON}$, it remains there until the polarity of the incoming waveform's current flow reverses. In this embodiment, this occurs after completion of the incoming waveform's first full half-cycle (at 50 ms). The incoming waveform's reversal at 50 ms in polarity causes M1's memristance $r_1$ to increase until it reaches its high-end value, $R_{OFF}$, of 100,000Ω (at 53 ms). Once M1's memristance $r_1$ reaches its high-end value, it remains there for the remainder of the incoming waveform's second full half-cycle (until 100 ms). This behavior then repeats with each full cycle of the incoming waveform VIN 304.

The behavior of memristor M2 320 is different from that of M1 for the low frequency input. Assume again that memristor M2 320 initially starts in its OFF state. M2's negative terminal 328 is coupled to the incoming signal VIN 304. Thus, the memristance $r_2$ of M2 remains at its high-end value, $R_{OFF}$, of 100,000Ω for the incoming waveform's first full half-cycle (until 50 milliseconds). Then, when the polarity of the current flowing through M2 120 reverses, the memristance $r_2$ of M2 drops off from its high-end value, $R_{OFF}$, of 100,000Ω to its low-end value, $R_{ON}$, of 100Ω (between times t=50 and 53 ms). Once M2's memristance $r_2$ reaches its low-end value, $R_{ON}$, it remains there until the completion of the incoming waveform's second full half-cycle (until 100 ms). When the polarity of the current flowing through M2 again reverses, M2's memristance $r_2$ increases until the memristance reaches its high-end value, $R_{OFF}$, of 100,000Ω (between times t=100 and 103 ms).

The memristances of M1 and M2 (one at 100,000Ω most of the time, and the other at 100Ω most of the time) together present an overall memristance of 99.90Ω (that is, virtually 100Ω) because the memristance of one memristor is high when the other is low (that is, they are out-of-phase). In this embodiment, this permits the circuit of FIG. 3 to pass the incoming signal at the relatively high level of 333 mV. The value of 333 mV is the consequence of the fact that the resistance of RSOURCE is 100Ω; that the resistance of RLOAD is 100Ω; and that the memristance of M1 and M2, taken together is approximately 100Ω. The net effect is that the circuit as a whole acts as a three-to-one voltage divider.

The output waveform at VOUT 305 is an almost perfect sine wave with the imperfection being caused by the relatively short transitional period at the beginning of each full half cycle. Note that the output is in-phase with the input. If the initial conditions for memristors M1 and M2 are other than the 100,000Ω assumed above, then the transitional period may be reduced.

Consider a high frequency that is squarely in the stopband (e.g., 10 kHz) where the circuit of FIG. 3 strongly attenuates the incoming signal. Between times t=0 and 50 microseconds (the incoming signal's first half-cycle), current is flowing through M1 in the positive direction and, consequently, M1's memristance $r_1$ starts to drops off from about 100,000Ω (its high-end value). However, because the incoming signal's frequency is high, comparatively little current flows through M2 by the end of the incoming waveform's first half-cycle at 50 µs. As a result, $r_1$ gets to only about 95,000Ω by 50 µs. At that time, the polarity of the incoming waveform reverses—that is, current starts flowing through M1 in the negative direction. Thus, M1's memristance $r_1$ starts to increase until it reaches about 100,000Ω. The net effect is that, in this high frequency case, M1's memristance always remains between about 95,000Ω and about 100,000Ω.

Assuming that M2's memristance $r_2$ initially starts at about 100,000Ω (its OFF state), then during the incoming waveform's first half-cycle between times t=0 and 50 µs, $r_2$ remains at substantially that level because current of positive polarity flows through M2 from its negative terminal to its positive terminal. During the incoming waveform's second half-cycle between times t=50 and 100 µs when the polarity of the incoming waveform reverses, M2's memristance $r_2$ decreases. However, because the incoming signal's frequency is high, comparatively little current flows through M2 before the polarity of the incoming waveform again reverses at 100 µs. As a result, $r_2$ only reaches about 95,000Ω by 100 µs. Between times t=100 and 150 milliseconds (the incoming waveform's third half-cycle), M2's memristance $r_2$ increases and returns to about 100,000Ω. The net effect is that, in this high frequency case, M2's memristance always remains between about 95,000Ω and about 100,000Ω.

The memristance of both M1 and M2 remain in the range between about 95,000Ω and about 100,000Ω and together present combined memristance in the neighborhood of 47,500Ω. Because of this high resistance, the circuit of FIG. 3 strongly attenuates the incoming high-frequency signal.

In summary, for low frequencies, the circuit of FIG. 3 does not strongly attenuate the incoming input signal because sufficient current of positive polarity flows through the first memristor during each positive half-cycle to rapidly drive its memristance down to its low-end value of 100Ω, thereby reducing the combined memristance of the two memristors to virtually 100Ω, and thus permitting the incoming signal to be passed at a high amplitude. During each negative half-cycle, sufficient current of negative polarity flows through the second memristor to rapidly drive its memristance down to its low-end value of 100Ω, thus the incoming signal is similarly passed at a high amplitude.

Moreover, for high frequencies, the circuit of FIG. 3 strongly attenuates the incoming signal. The small amount of positive current during each positive half-cycle barely changes memristance M1 from 100,000Ω, and the negative current during the next negative half-cycle fully restores the memristance to 100,000Ω. The small amount of negative current during each negative half-cycle barely changes the memristance M2 from 100,000Ω, and the positive current during the next positive half-cycle restores the memristance to 100,000Ω. Therefore, the combined memristance of the two memristors together is in the neighborhood of about 47,500Ω. Thus, the incoming signal is again strongly attenuated.

In other words, the circuit of FIG. 3 performs the function of a lowpass filter by exploiting the differing amounts of change in memristance caused by the differing amounts of current that flow through the two memristors in the differing amounts of time between the incoming signal's reversals of polarity.

The filtering function of the above-described lowpass filter circuit has the advantage of being constructed of passive elements and of producing an output signal that is in-phase with the incoming signal.

Numerous other embodiments of the principles illustrated by the circuit of FIG. 3 may be realized. For example, another embodiment of the circuit of FIG. 3 performs the function of a lowpass filter using different memristor parameters, namely $R_{ON}$=100Ω; $R_{OFF}$=16 kΩ; and k=100 for both memristors. The Strukov Article proposed these memristor parameters for a single memristor.

Table 2 shows the frequency response for this second embodiment. Column 1 of this table shows the frequency of the incoming signal; column 2 shows the RMS value of VOUT in millivolts (mV); and column 3 shows the gain in decibels.

TABLE 2

Frequency Response of another embodiment
of the lowpass filter of FIG. 3

| Frequency (Hz) | VOUT (mV) | Gain (dB) |
|---|---|---|
| 0.001 | 333.9 | 0.00 |
| 0.01 | 333.2 | −0.02 |
| 0.1 | 311.7 | −0.60 |
| 0.2 | 269.8 | −1.85 |
| 0.5 | 58.19 | −15.18 |
| 1 | 14.33 | −27.35 |
| 10 | 12.36 | −28.63 |

The signal discrimination capabilities of the circuit of FIG. 3 are not limited to sine wave input signals, nor are they limited to symmetric input signals. To illustrate this point, Table 3 shows the frequency response of the circuit of FIG. 3 to an asymmetric square wave input signal. In this simulation, VSOURCE 300 produces an asymmetric square wave input signal whose voltage is +1 Volts for the first three-fourths of each period, and is −3 Volts for the remaining one fourth of the period. For example, if the frequency of the signal is 1 kHz, then the voltage will be +1 Volts for the first 0.75 mS of each cycle and −3V for the last 0.25 mS of each cycle. The circuit parameters used to produce Table 3 are identical to those used to produce Table 1, except that k=667,332 for both memristors. This choice of k has the effect of making the critical frequency be 1 kHz for this class of input signal. As can be seen by comparing Tables 1 and 3, the circuit of FIG. 3 has the same frequency discrimination capability for asymmetric square wave input signals that it does for sine wave input signals.

TABLE 3

Frequency Response of another embodiment of the lowpass filter
of FIG. 3, with an asymmetric square wave input signal

| Frequency (Hz) | VOUT (mV) | Gain (dB) |
|---|---|---|
| 10 | 574.5 | −0.04 |
| 100 | 548.1 | −0.45 |
| 500 | 406.8 | −3.04 |
| 600 | 368.7 | −3.90 |
| 700 | 314.8 | −5.27 |
| 800 | 250.1 | −7.27 |
| 900 | 167.4 | −10.76 |
| 980 | 81.46 | −17.01 |
| 1000 | 7.53 | −37.69 |
| 1100 | 5.13 | −41.02 |
| 1200 | 4.68 | −41.82 |

Lowpass filters with a cutoff frequency different from that shown in FIG. 4 may be designed by adjusting the common value of k for each memristor of the circuit of FIG. 3 and/or by adjusting the amplitude of the source voltage, $V_{SOURCE}$.

For example, as a baseline, consider an embodiment of the circuit of FIG. 3 in which the value of k for each memristor is $10^6$ and in which the source voltage is $V_{SOURCE}$=1 volt RMS. For purposes of illustration, assume that $R_{ON}$=100Ω and $R_{OFF}$=100,000Ω for both memristors.

Table 4 shows the frequency response when k=$10^6$ and $V_{SOURCE}$=1. Column 1 of this table shows the frequency of the incoming signal; column 2 shows the RMS value of VOUT in millivolts; and column 3 shows the gain in decibels.

TABLE 4

Frequency Response of another embodiment of the lowpass filter
of FIG. 3 where k = $10^6$ and $V_{SOURCE}$ = 1

| Frequency (Hz) | VOUT (mV) | Gain (dB) |
|---|---|---|
| 333 | 270.5 | −1.81 |
| 577 | 187.3 | −5.00 |
| 760 | 101.6 | −10.32 |
| 872 | 25.4 | −22.36 |
| 934 | 3.1 | −40.63 |
| 966 | 3.0 | −41.01 |
| 1,000 | 2.9 | −41.31 |

Table 5 shows that if the value of k for each memristor is multiplied by a factor of 10 from $10^6$ to $10^7$, then the frequency response curve is shifted upwards to higher frequencies by a factor of 10 and, in particular, the cutoff frequency is multiplied by a factor of 10.

TABLE 5

Frequency Response of another embodiment of the lowpass filter
of FIG. 3 where k = $10^7$ and $V_{SOURCE}$ = 1

| Frequency (Hz) | VOUT (mV) | Gain (dB) |
|---|---|---|
| 3,333 | 265.9 | −1.96 |
| 5,774 | 186.9 | −5.02 |
| 7,598 | 101.6 | −10.31 |
| 8,717 | 25.3 | −22.40 |
| 9,336 | 3.1 | −40.63 |
| 9,663 | 3.0 | −41.01 |
| 10,000 | 2.9 | −41.31 |

Table 6 shows that if the value of $V_{SOURCE}$ is multiplied by a factor of 10 from 1 volt RMS to 10 volts RMS (leaving k at the baseline level of $10^6$), then the frequency response curve is shifted upwards to higher frequencies by a factor of 10 and, in particular, the cutoff frequency is multiplied by a factor of 10.

TABLE 6

Frequency Response of another embodiment of the lowpass filter
of FIG. 3 where k = $10^6$ and $V_{SOURCE}$ = 10

| Frequency (Hz) | VOUT (mV) | Gain (dB) |
|---|---|---|
| 3,333 | 2659 | −1.96 |
| 5,774 | 1869 | −5.02 |
| 7,598 | 1016 | −10.31 |
| 8,717 | 253 | −22.40 |
| 9,336 | 31.0 | −40.63 |
| 9,663 | 29.6 | −41.01 |
| 10,000 | 28.6 | −41.31 |

Thus, the circuit of FIG. 3 discriminates between certain classes of signals on the basis of frequency in a manner similar to that of a voltage-tunable lowpass filter. Voltage-tunable lowpass filters employing active circuit elements (e.g., transistors) are well-known. However, the circuit of FIG. 3 is a voltage-tunable lowpass filter composed of only passive elements.

In general, the cutoff frequency of the lowpass filter circuit of FIG. 3 may be determined analytically, as a function of k and other parameters. By varying these parameters, a circuit designer can achieve filters with different desired cutoff frequencies.

Consider a single memristor with maximum memristance $R_{OFF}$ and minimum memristance $R_{ON}$. Suppose that the voltage difference across the memristor (that is, the difference between the voltage at the memristor's positive terminal and the voltage at the memristor's negative terminal) at time t is equal to $$V\sin(\omega t).$$

Let $r=R_{OFF}/R_{ON}$ denote the ratio between the memristor's maximum and minimum memristance. Let $x(t)=w(t)/D$ be the state variable of the memristor. The memristance at time t is $$R_{ON}x(t)+R_{OFF}(1-x(t))=R_{ON}(r(1-x(t))+x(t)).$$

The current through the memristor is therefore $$i(t)=V\sin(\omega t)/(R_{ON}(r(1-x(t))+x(t))).$$

Recall that $$\frac{dw(t)}{dt} = u_v i(t) R_{ON}/D.$$

Dividing both sides by D, and making the substitutions $x(t)=w(t)/D$ and $k=u_v/D^2$, we obtain $$\frac{dx(t)}{dt} = ki(t)R_{ON}.$$

Substituting in the previously-derived expression for i(t), the following equation is obtained $$\frac{dx(t)}{dt} = kR_{ON}V\sin(\omega t)/(R_{ON}(r(1-x(t))+x(t))).$$

With initial condition $x(t)=0$, this differential equation has the solution $$x(t) = \frac{r - \sqrt{r^2 + 2kV(r-1)(\cos(\omega t)-1)/\omega}}{r-1}.$$

The time when the memristor's state variable first becomes equal to 1 is of interest. Solving for $x(t_0)=1$, this happens at time $$t_0 = \arccos(1-\omega(r+1)/(2kV))/\omega.$$

The angle at which the memristor's state variable first becomes equal to 1 is therefore $$\theta_0 = \omega t_0 = \arccos(1-\omega(r+1)/(2kV)).$$

Of particular interest is the angular frequency at which $\theta_0=\pi$, meaning that the memristor's state variable first reaches 1 after exactly one half-cycle. To find this particular angular frequency $\omega_c$, we solve the equation $$\arccos(1-\omega_c(r+1)/(2kV))=\pi.$$

This equation has the solution $$\omega_c = 4kV/(r+1).$$

The corresponding frequency $f_c = \omega_c/2\pi$ is referred to as the memristor's critical frequency. Observe that the expression for $\theta_0$ can be rewritten as $$\theta_0 = \arccos(1-2\omega/\omega_c) = \arccos(1-2f/f_c),$$

where $f=\omega/2\pi$ is the frequency of the applied voltage.

To illustrate the significance of the critical frequency, an approximation to the root mean squared current across the memristor is derived. A good approximation to the root mean squared current can be obtained by treating the memristor as an open circuit for angles less than $\theta_0$ (i.e., angles where the memristor's state variable is strictly less than 1) and as a resistor with resistance $R_{ON}$ for angles between $\theta_0$ and $\pi$ (i.e., angles where the memristor's state variable equals 1). With this approximation, the root mean squared output current is $$\frac{V}{R_{ON}}\sqrt{\frac{1}{\pi}\int_{\theta_0}^{\pi}(\sin\theta)^2 d\theta} = \frac{V}{\sqrt{2\pi}\,R_{ON}}\sqrt{\pi - \theta_0 + \cos(\theta_0)\sin(\theta_0)}$$

$$= \frac{V}{\sqrt{2\pi}\,R_{ON}}\sqrt{\pi - \arccos\left(1 - 2\frac{f}{f_c}\right) + \left(1 - 2\frac{f}{f_c}\right)\sqrt{1 - \left(1 - 2\frac{f}{f_c}\right)^2}}.$$

Table 7 shows the root mean squared current for various frequencies, calculated using the approximation just derived, assuming that $k=27,824$, $R_{ON}=200\Omega$, $R_{OFF}=100,000\Omega$, and $V=2*2^{1/2}$ volts so the root mean squared applied voltage is 2 volts. The value of $f_c=100$ Hz. The table also shows the results of a SPICE simulation. As can be seen, the above theory is consistent with the results of the SPICE simulations.

TABLE 7

An approximation of root mean squared current through a memristor driven by an applied voltage of frequency f

| Frequency (Hz) | Measured SPICE RMS current (mA) | Approximate RMS current (mA) |
| --- | --- | --- |
| 10.0 | 9.72 | 9.74 |
| 30.0 | 8.53 | 8.65 |
| 50.0 | 7.08 | 7.07 |
| 70.0 | 4.89 | 5.02 |
| 80.0 | 3.47 | 3.77 |
| 90.0 | 2.29 | 2.28 |
| 98.0 | 0.63 | 0.69 |
| 99.8 | 0.13 | 0.12 |
| 99.9 | 0.09 | 0.07 |
| 100.0 | 0.07 | 0.00 |

Returning to the circuit in FIG. 3, suppose that VSOURCE supplies a voltage of $V\sin(\omega t)$. Because the resistances of resistors RSOURCE 301 and RLOAD 302 are small relative to the memristance of the parallel arrangement of memristors M1 310 and M2 320, the voltage across each of these memristors will be approximately $V\sin(\omega t)$. Thus, for frequencies less than or equal to $f_c$, the state variable of memristor M1 310 will be close to 1 after one half-cycle of the sine wave, and its memristance will therefore be close to $R_{ON}$. For frequencies substantially less than $f_c$, the memristance of memristor M1 310 will be close to $R_{ON}$ before the end of one half cycle of the sine wave, and the root mean squared current across memristor M1 310 will be large. As illustrated in the preceding discussion, such frequencies are passed by the circuit of FIG. 3. For frequencies substantially greater than $f_c$, the memristance of memristor M1 310 will never reach $R_{ON}$, and the root mean squared current across memristor M1 310 will be small. As illustrated in the preceding discussion, such frequencies are suppressed by the circuit of FIG. 3. It is in this sense that $f_c$ acts as the critical frequency of the lowpass filter of FIG. 3.

Figure 6:
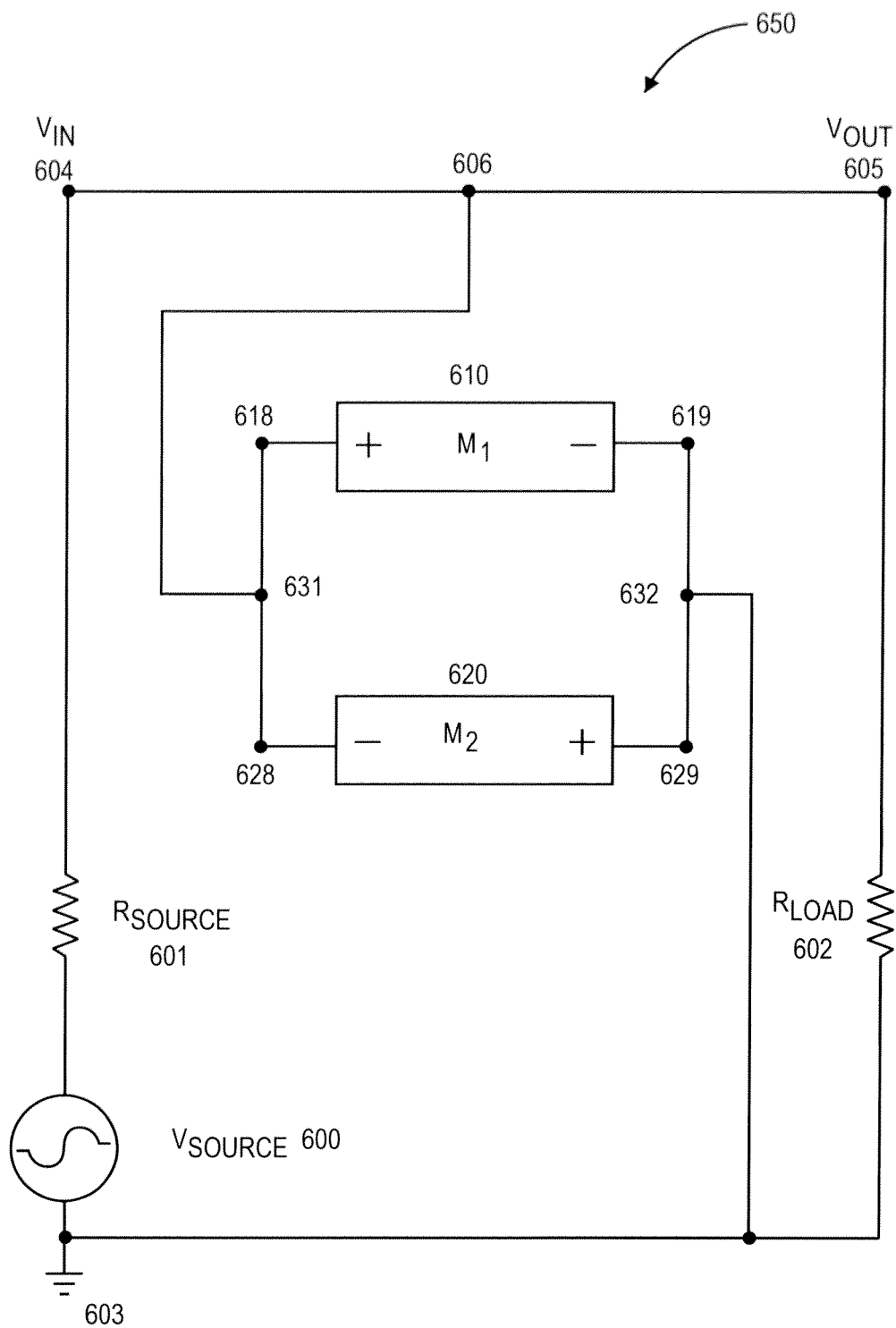
FIG. 6 illustrates a signal-processing device (a highpass filter circuit) having memristors in accordance with one embodiment.

There are many uses for circuits that have the frequency discrimination capability of the arrangement of memristors shown in FIG. 5. Highpass filters can be constructed using the arrangement of memristors shown in FIG. 5. FIG. 6 shows one embodiment of a signal-processing device 650 (a highpass filter circuit). In this embodiment, a voltage source VSOURCE 600 supplies an alternating current signal through source resistor RSOURCE 601. The circuit's output terminal VOUT 605 is coupled through load resistor RLOAD 602 to ground 603.

The circuit of FIG. 6 includes the arrangement of memristors shown in FIG. 5 in that the positive terminal 618 of a first memristor M1 610 is coupled at connection point 631 to the negative terminal 628 of a second memristor M2 620 and in that the negative terminal 619 of the first memristor M1 610 is coupled at connection point 632 to the positive terminal 629 of the second memristor M2 620. The incoming signal is fed to connection points 606 and 631. Connection point 632 is coupled to ground 603.

In an embodiment, an output amplitude VOUT 605 of the device 650 is, after an initial transitional period, predominantly at a first level if the frequency of the input signal is less than a first frequency and predominantly at a second level if the frequency of the input signal is greater than a second frequency. The second level is substantially higher than the first level. For this embodiment, the signal-processing device is a highpass filter circuit.

For purposes of illustrating the operation of the circuit of FIG. 6, in one embodiment, the voltage source VSOURCE is 1 volt RMS; the source resistance RSOURCE 601 is 10 K$\Omega$; the load resistance RLOAD 602 is 10 K$\Omega$; $R_{ON}$=100$\Omega$; $R_{OFF}$=100,000$\Omega$; and k=$10^6$ for both memristors Table 8 shows the frequency response of the circuit of FIG. 6 to various frequencies between 1 Hz and 100 kHz. Column 1 of the table shows the frequency of VSOURCE 600; column 2 shows the RMS value of VOUT 605 in millivolts (mV); and column 3 shows the gain in decibels. As can be seen, low frequencies are attenuated (about −30 dB gain) and high frequencies are passed at about 454 mV.

TABLE 8

Frequency Response of the highpass filter of FIG. 6

| Frequency (Hz) | VOUT (mV) | Gain (dB) |
| --- | --- | --- |
| 1 | 11.71 | −32.61 |
| 3 | 18.61 | −28.58 |
| 10 | 37.24 | −22.56 |
| 33 | 88.17 | −15.07 |
| 100 | 193.3 | −8.25 |
| 333 | 406.9 | −1.79 |
| 1,000 | 448.9 | −0.94 |
| 3,333 | 450.2 | −0.91 |
| 10,000 | 454.0 | −0.84 |
| 33,333 | 454.1 | −0.84 |
| 100,000 | 454.2 | −0.83 |

The circuit of FIG. 6 operates as a highpass filter for low frequencies (e.g., 1 Hz) because sufficient current of positive polarity flows through the first memristor during each positive half-cycle to rapidly drive its memristance down to its low-end value of 100$\Omega$, thereby reducing the memristance of the two parallel memristors to virtually 100$\Omega$ so that the incoming signal current is effectively shunted around the load resistor, thus yielding a strongly attenuated output signal. In a similar manner during each negative half-cycle, sufficient current of negative polarity flows through the second memristor to rapidly drive its memristance down to its low-end value of 100$\Omega$, thus shunting the incoming signal current around the load resistor and yielding a strongly attenuated output signal.

Moreover, the circuit of FIG. 6 operates as a highpass filter for high frequencies (e.g., 10 kHz) because substantially no current of positive polarity flows through the first memristor during each positive half-cycle, so that its memristance barely changes from its high-end value of 100,000$\Omega$ (decreasing to approximately 97,300$\Omega$), thereby making the memristance of the two parallel memristors approximately half their individual high-end values of 100,000$\Omega$. This high-resistance path effectively eliminates the previously mentioned shunting, thus yielding an output signal that is nearly the theoretical maximum amplitude (i.e., the amplitude that would be achieved if the two memristors were not present and therefore provided no path through which current could flow to ground). In a similar manner during each negative half-cycle, substantially no current of negative polarity flows through the second memristor such that its memristance barely changes from its high-end value, thereby yielding an output signal that is nearly the theoretical maximum amplitude.

In other words, the circuit of FIG. 6 performs the function of a highpass filter by exploiting the different amounts of change in memristance caused by the different amounts of current that can flow through the two memristors in the different amounts of time between the incoming signal's reversals of polarity.

Figure 7:
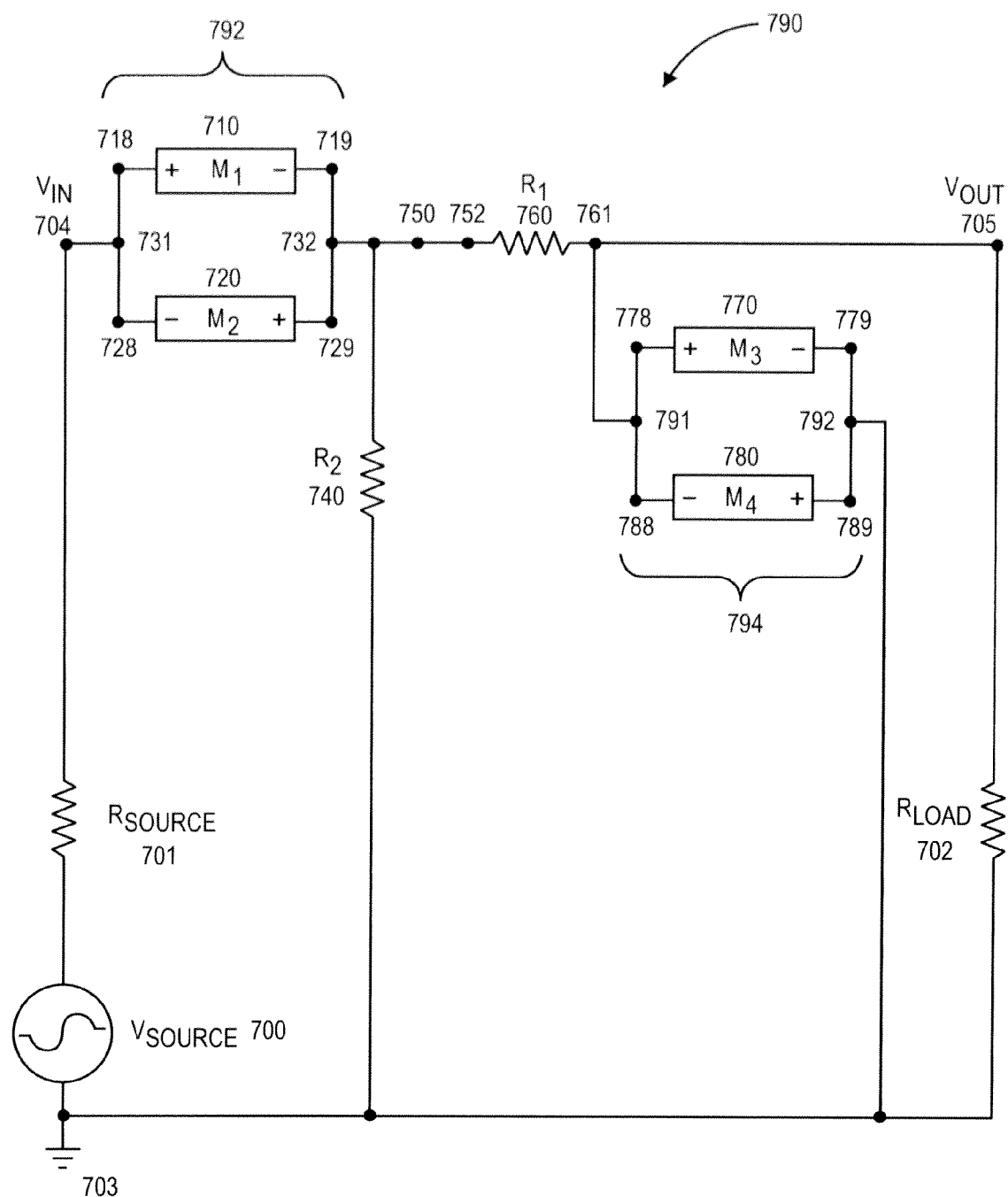
FIG. 7 illustrates a signal-processing device (a bandpass filter circuit) having memristors in accordance with one embodiment.

A bandpass filter can be constructed by employing the principles described above for creating lowpass filters and highpass filters each containing the arrangement of memristors shown in FIG. 5. FIG. 7 illustrates a signal-processing device 790 (a bandpass filter circuit) having memristors in accordance with one embodiment. A voltage source VSOURCE 700 supplies an alternating current signal through source resistor RSOURCE 701. The circuit's output terminal VOUT 705 is coupled through load resistor RLOAD 702 to ground 703. The circuit of FIG. 7 includes a series cascade of instances of the arrangement of two memristors shown in FIG. 5. Specifically, a series cascade includes an arrangement of memristors that performs the functions of a lowpass filter and an arrangement of memristors that performs the functions of a highpass filter.

The circuit of FIG. 7 includes a first instance of the arrangement of memristors shown in FIG. 5. Specifically, the positive terminal 718 of memristor M1 710 is coupled at connection point 731 to the negative terminal 728 of memristor M2 720, and the negative terminal 719 of memristor M1 710 is coupled at connection point 732 to the positive terminal 729 of memristor M2 720. This first arrangement of memristors acts as a lowpass filter in the manner of the circuit in FIG. 3.

In addition, the circuit of FIG. 7 includes a second instance of the arrangement of memristors shown in FIG. 5 involving memristors M3 770 and M4 780. Specifically, the positive terminal 778 of memristor M3 770 is coupled at connection point 791 to the negative terminal 788 of memristor M4 780, and the negative terminal 779 of memristor M3 770 is coupled at connection point 792 to the positive terminal 789 of memristor M4 780. This second arrangement of memristors acts as a highpass filter in the manner of the circuit in FIG. 6.

The incoming signal is fed to connection point 731 and memristors M1 710 and M2 720. The output signal of the first arrangement of memristors at connection point 732 is then fed (1) through resistor R2 740 to ground 703 and (2) onwards to resistor R1 760 and the arrangement of memristors M3 770 and M4 780 and the circuit's output terminal VOUT 705. The output 792 of the arrangement of memristors M3 770 and M4 780 is coupled to ground 703.

In an embodiment, a first filter device 792 provides a first output signal at connection point 732. The first filter device includes M1 710 and M2 720, which are coupled as discussed above. A second filter device 794 provides a second output signal at VOUT 705. The second filter device 794 includes an arrangement of memristors M3 770 and M4 780. The first output signal is fed in a series cascade into the second filter device 794. The output amplitude of the device 790 is, after an initial transitional period, predominantly at a first level if the frequency of an input signal VIN of the device is less than a first frequency, predominantly at a second level if the frequency of the input signal is between a second and third frequency, and predominantly at a third level if the frequency of the input signal is greater than a fourth frequency. The second level is substantially higher than the first and third levels.

For purposes of illustrating the operation of one embodiment of the circuit of FIG. 7, the voltage source VSOURCE is 1 volt RMS; the source resistance RSOURCE 701 is 100Ω; the load resistance RLOAD 702 is 10 kΩ; R1 760 is 10 kΩ; R2 740 is 100Ω; $R_{ON}$=100Ω for all four memristors; $R_{OFF}$=100,000Ω for all four memristors; $k_1$=$10^7$ (for memristors M1 710 and M2 720); and $k_2$=$10^6$ (for memristors M3 770 and M4 780).

Table 9 shows the frequency response of the circuit of FIG. 7 for various frequencies between 1 Hz and 100 kHz. Column 1 of the table shows the frequency of VSOURCE 700; column 2 shows the RMS value of VOUT 705 in millivolts; and column 3 shows the gain in decibels. As can be seen, low frequencies are attenuated (about −30 dB gain); midrange frequencies are passed with only a small loss; and high frequencies are strongly attenuated (about −45 dB gain).

TABLE 9

Frequency response of the bandpass filter of FIG. 7

| Frequency (Hz) | VOUT (mV) | Gain (dB) |
|---|---|---|
| 1 | 5.9 | −28.04 |
| 3 | 11.6 | −22.12 |
| 10 | 27.5 | −14.64 |
| 33 | 65.0 | −7.18 |
| 100 | 131.2 | −1.08 |
| 333 | 148.6 | 0.00 |
| 1,000 | 145.9 | −0.16 |
| 3,333 | 122.5 | −1.68 |
| 10,000 | 1.3 | −41.16 |
| 33,333 | 1.0 | −43.73 |
| 100,000 | 0.9 | −44.15 |

A gain element may be advantageously used in connection with the bandpass filter of FIG. 7. In one embodiment, a gain element (with a fixed gain of 3) is inserted between points 750 and 752, and the same parameter values as above are used. In this embodiment, the input of the gain element is connected to point 750 and the output is connected to point 752. Table 10 shows the frequency response of the circuit of FIG. 7 with the added gain element for various frequencies between 1 Hz and 100 kHz. As can be seen, low frequencies are attenuated (about −30 dB gain); midrange frequencies are passed with only a small loss; and high frequencies are strongly attenuated (about −50 dB gain).

TABLE 10

Frequency response of a bandpass filter employing a gain element

| Frequency (Hz) | VOUT (mV) | Gain (dB) |
|---|---|---|
| 1 | 11.8 | −38.56 |
| 3 | 18.9 | −34.45 |
| 10 | 38.7 | −28.25 |
| 33 | 90.5 | −20.87 |
| 100 | 199.5 | −14.00 |
| 333 | 414.0 | −7.66 |
| 1,000 | 436.0 | −7.21 |
| 3,333 | 368.6 | −8.67 |
| 10,000 | 3.9 | −48.08 |
| 33,333 | 2.9 | −50.68 |
| 100,000 | 2.8 | −51.10 |

Figure 8:
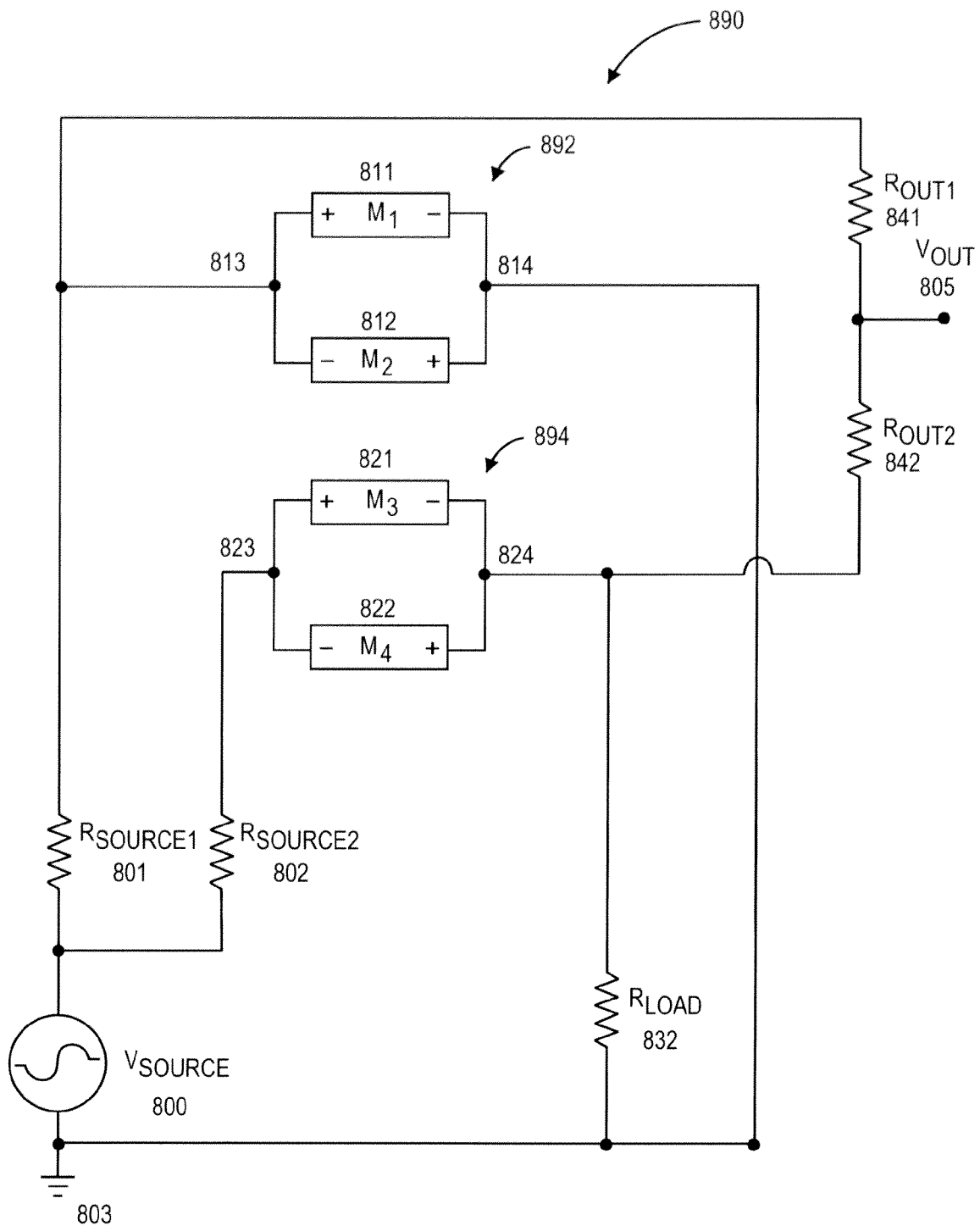
FIG. 8 illustrates a signal-processing device (a bandstop filter circuit) having memristors in accordance with one embodiment.

A bandstop filter may be constructed by employing the principles used to create lowpass filters and highpass filters, each containing the arrangement of memristors shown in FIG. 5. FIG. 8 illustrates a signal-processing device 890 (a bandstop filter circuit) having memristors in accordance with one embodiment. A voltage source VSOURCE 800 supplies an alternating current signal. The circuit of FIG. 8 contains a parallel combination of instances of the arrangement of two memristors shown in FIG. 5. Specifically, the circuit includes a parallel combination of a lowpass filter and a highpass filter. The incoming signal from voltage source VSOURCE 800 is passed through source resistor RSOURCE1 801. Its output 813 goes to an arrangement of memristors, similar to the arrangement for highpass filtering shown in FIG. 6, in which the positive terminal of memristor M1 811 is coupled at connection point 813 to the negative terminal of memristor M2 812 and the negative terminal of memristor M1 811 is coupled at connection point 814 to the positive terminal of memristor M2 812. The signal at 814 is then coupled to ground 803.

The incoming signal from voltage source VSOURCE 800 is also passed through source resistor RSOURCE2 802 to an arrangement of memristors, similar to the arrangement for lowpass filtering shown in FIG. 3, in which the positive terminal of memristor M3 821 is coupled at connection point 823 to the negative terminal of memristor M4 822 and the negative terminal of memristor M3 821 is coupled at connection point 824 to the positive terminal of memristor M4 822. The signal at 824 is coupled, through load resistor RLOAD 832, to ground 803.

The signal at point 813 is also coupled, through resistor ROUT1 841 to output terminal VOUT 805. The signal at point 824 is also coupled, through resistor ROUT2 842 to output terminal VOUT 805. In this embodiment, the voltage source VSOURCE is 1 volt RMS; the source resistance RSOURCE1 801 is 20 kΩ; the source resistance RSOURCE2 802 is 100Ω; the load resistance RLOAD 832 is 100Ω; output resistor ROUT1 is 5 kΩ; output resistor ROUT2 is 5 kΩ; $R_{ON}$=100Ω for all four memristors; $R_{OFF}$=100,000Ω for all four memristors; k=$10^6$ for memristors M3 and M4; and k=$10^9$ for memristors M1 and M2.

Resistors ROUT1 841 and ROUT2 842 act together as a voltage divider. The voltage at output VOUT 805 is equal to ROUT2/(ROUT1+ROUT2) times the voltage at point 813 plus the quantity ROUT1/(ROUT1+ROUT2) times the voltage at point 824. In this embodiment, ROUT1=ROUT2 so that the voltage at output VOUT 805 is equal to the average of the voltage at point 813 and the voltage at point 824.

Table 11 shows the frequency response of the bandstop filter of FIG. 8 for various frequencies. The table shows the frequency of VSOURCE 800; the RMS value of VOUT 805 in millivolts; and the gain in decibels. As can be seen, low frequencies are passed; midrange frequencies are attenuated; and high frequencies are passed.

TABLE 11

Frequency response of the bandstop filter of FIG. 8

| Frequency (Hz) | VOUT (mV) | Gain (dB) |
|---|---|---|
| 10 | 169.5 | 0.00 |
| 33 | 168.7 | −0.04 |
| 100 | 164.4 | −0.27 |
| 333 | 134.9 | −1.98 |
| 1,000 | 4.9 | −30.77 |
| 3,333 | 8.0 | −26.48 |
| 10,000 | 16.7 | −20.11 |
| 33,333 | 39.9 | −12.56 |
| 100,000 | 86.4 | −5.85 |
| 333,333 | 145.4 | −1.33 |
| 1,000,000 | 149.6 | −1.08 |

In an embodiment, the device 890 includes a filter device 892 that provides a first output signal. The filter device 892 includes memristor M1 811 that is coupled to memristor M2 812 as discussed above. A filter device 894 provides a second output signal. The filter device 894 includes memristor M1 821 that is coupled to memristor M2 822 as discussed above. The filter device 892 and filter device 894 form a parallel arrangement and the output of the signal-processing device 890 is based on the output signals of devices 892 and 894. The output amplitude of the device 890 is, after an initial transitional period, predominantly at a first level if the frequency of the input signal of the device is less than a first frequency, predominantly at a second level if the frequency of the input signal is between a second and third frequency, and predominantly at a third level if the frequency of the input signal is greater than a fourth frequency. The first level is substantially higher than the second and third levels.

A comb filter is a filter that contains at least two distinct passbands, each surrounded by a stopband. It will be recognized that a comb filter may be constructed by combining lowpass filters and highpass filters, each containing the arrangement of memristors shown in FIG. 5.

A crossover filter is a one-input, two-output circuit. The amplitude of the first output is, after an initial transitional period, predominantly at a high level if the frequency of the circuit's input is less than a specified frequency and at a substantially lower level if the circuit's input is greater than the specified frequency (a lowpass filter). The amplitude of this second output is, after an initial transitional period, predominantly at a low level if the frequency of the circuit's input is less than the specified frequency and at a substantially higher level if the circuit's input is greater than the specified frequency (a high-pass filter). A crossover filter can be constructed by feeding the output of a lowpass filter such as shown in FIG. 3 to the circuit's first output and by feeding the output of a highpass filter such as shown in FIG. 6 to the circuit's second output.

Figure 9:
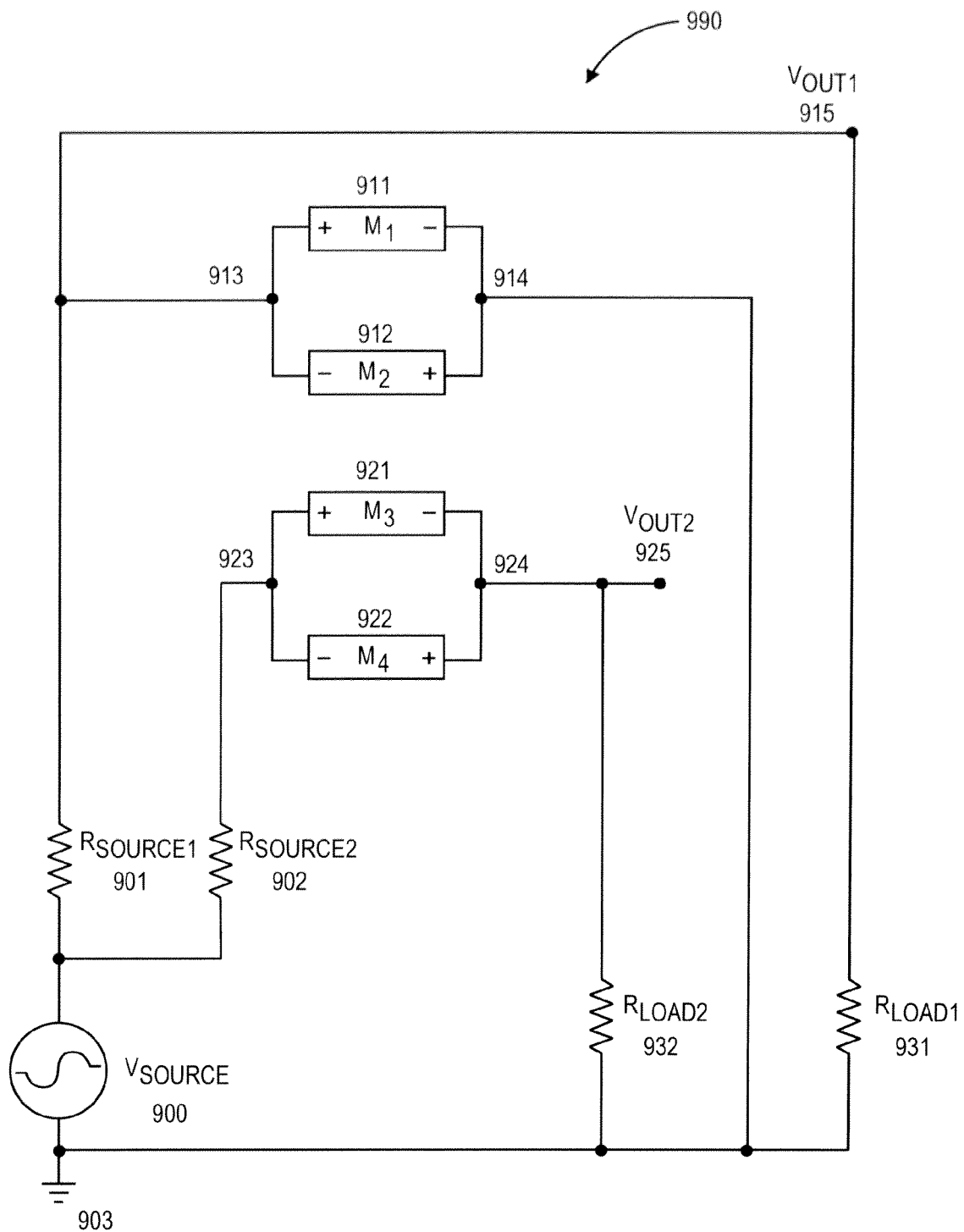
FIG. 9 illustrates a signal-processing device (a crossover filter circuit) having memristors in accordance with one embodiment.

FIG. 9 illustrates a signal-processing device 990 (a crossover filter circuit) having memristors in accordance with one embodiment. In this embodiment, an alternating current voltage source VSOURCE 900 supplies a signal. The incoming signal from voltage source VSOURCE 900 is passed through source resistor RSOURCE1 901. Its output 913 goes directly to output VOUT1 915 as well as to an arrangement of memristors, similar to the arrangement for highpass filtering shown in FIG. 6, in which the positive terminal of memristor M1 911 is coupled at 913 to the negative terminal of memristor M2 912 and the negative terminal of memristor M1 911 is coupled at 914 to the positive terminal of memristor M2 912. The signal at 914 is then coupled to ground 903. Output terminal VOUT1 915 is coupled through load resistor RLOAD1 931 to ground 903.

The incoming signal from voltage source VSOURCE 900 is also passed, in this embodiment, through source resistor RSOURCE2 902 to an arrangement of memristors, similar to the arrangement for lowpass filtering shown in FIG. 3, in which the positive terminal of memristor M3 921 is coupled at 923 to the negative terminal of memristor M4 922 and the negative terminal of memristor M3 921 is coupled at 924 to the positive terminal of memristor M4 922. The signal at 924 then goes to output VOUT2 925. Output VOUT2 925 is coupled through load resistor RLOAD2 932 to ground 903.

In this embodiment, the voltage source VSOURCE is 1 volt RMS; source resistor RSOURCE1 901 is 16,667 kΩ; source resistor RSOURCE2 902 is 100Ω; load resistor RLOAD1 931 is 10 kΩ; load resistor RLOAD2 932 is 100Ω; $R_{ON}$=100Ω for all four memristors; $R_{OFF}$=100,000Ω for all four memristors; and k=$10^6$ for all four memristors. Note that the values of k are substantially identical for all memristors in this circuit because the cutoff frequency of both the lowpass and highpass portions should be substantially the same.

Table 12 shows the frequency response of the crossover filter of FIG. 9 for various frequencies. Table 12 shows the RMS value of the output for both VOUT1 and VOUT2 in millivolts and the gain in decibels. As can be seen in the VOUT1 and Gain1 columns (which reflect the output of the highpass portion), the incoming signal is attenuated for lower frequencies at VOUT1 and passed (only slightly attenuated) for high frequencies. The VOUT2 and Gain2 NOTE columns (which reflect the output of the lowpass portion) show that the incoming signal is passed for lower frequencies at VOUT2 and attenuated for higher frequencies.

TABLE 12

Frequency response of the crossover filter of FIG. 9

| Frequency (Hz) | VOUT1 (mV) | Gain1 (dB) | VOUT2 (mV) | Gain2 (dB) |
|---|---|---|---|---|
| 1 | 8.4 | −32.02 | 333.4 | 0.00 |
| 3 | 14.8 | −27.05 | 333.3 | 0.00 |
| 10 | 33.8 | −19.88 | 333.0 | −0.01 |
| 33 | 80.4 | −12.35 | 331.4 | −0.05 |
| 100 | 176.6 | −5.52 | 323.0 | −0.27 |
| 333 | 318.9 | −0.38 | 270.9 | −1.80 |
| 1000 | 330.2 | −0.08 | 2.9 | −41.28 |
| 3333 | 332.4 | −0.02 | 2.1 | −43.85 |
| 10000 | 333.0 | −0.01 | 2.0 | −44.27 |
| 33333 | 333.2 | 0.00 | 2.0 | −44.41 |
| 100000 | 333.2 | 0.00 | 2.0 | −44.44 |

Figure 10A:
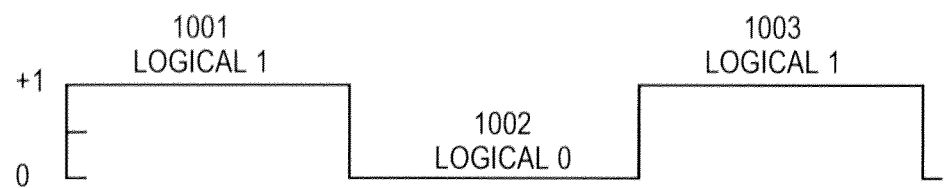
FIG. 10a illustrates a binary digital input stream in accordance with one embodiment.

As discussed above, there are many uses for circuits that have the frequency discrimination capability of the arrangement of memristors shown in FIG. 5. In the well-known and widely used methodology of frequency shift key modulation, a constant-frequency, constant-amplitude carrier signal is modulated by a binary digital input stream (e.g., a square wave that is high when the input signal represents a logical one and is low when the input signal represents a logical zero). FIG. 10*a* illustrates a binary digital input stream in accordance with one embodiment.

Figure 10B:
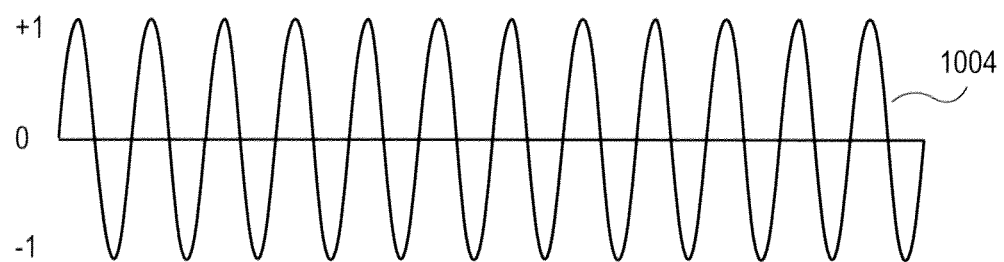
FIG. 10b illustrates a constant-frequency, constant-amplitude carrier for frequency shift key modulation using an arrangement of memristors in accordance with one embodiment.

FIG. 10*b* illustrates a constant-frequency, constant-amplitude carrier 1004 for frequency shift key modulation using an arrangement of memristors in accordance with one embodiment. The constant-frequency, constant-amplitude carrier

Figure 10C:
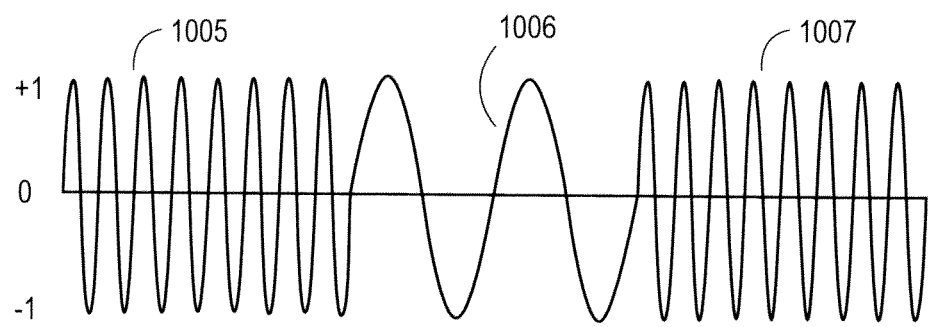
FIG. 10c illustrates an encoded frequency modulation (FM) output signal in accordance with one embodiment.

1004 is changed to one of two different frequencies depending on the digital binary input stream. FIG. 10a illustrates a binary input stream in accordance with one embodiment. Logical one 1001 in the binary input stream of FIG. 10a is represented, in the digital domain, by a certain amplitude voltage (e.g., +1 in this example). When carrier 1004 is modulated by logical one 1001, the result is a certain (higher in this example) frequency 1005 in the encoded frequency modulation (FM) output signal illustrated in FIG. 10c in accordance with one embodiment. When carrier 1004 is modulated by logical zero 1002, the result is a different (lower in this example) frequency 1006 in the encoded frequency modulation (FM) output signal. Then, when carrier 1004 is modulated by logical one 1003, the result is the first (higher in this example) frequency 1007 in the encoded frequency modulation (FM) output signal. The result is a constant-amplitude FM signal that encodes the original incoming digital binary data stream.

A frequency shift key decoder can be used to convert an encoded FM signal produced by a frequency shift key modulation encoding process to a digital binary output stream.

Figure 11:
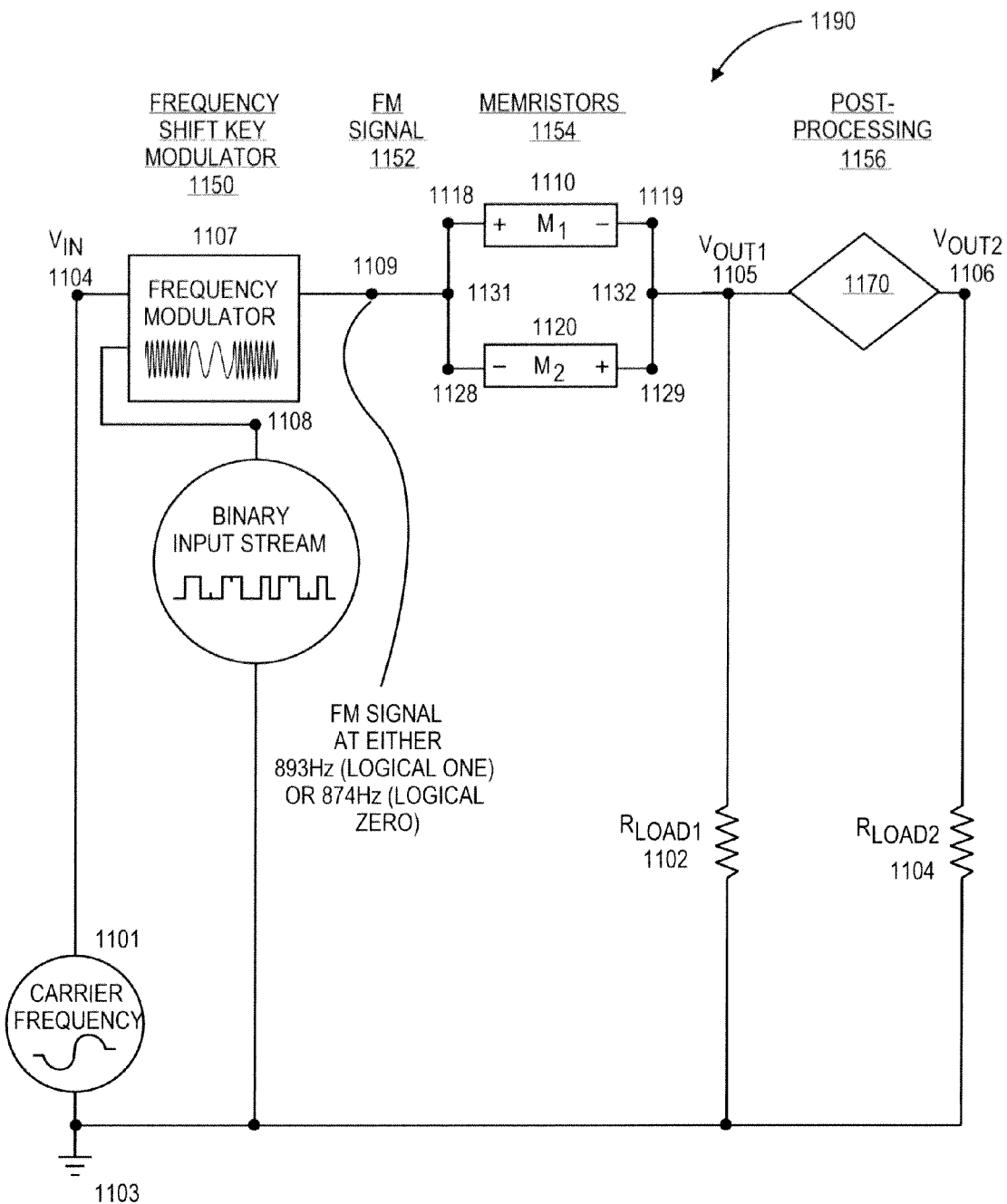
FIG. 11 illustrates one embodiment of a signal-processing device (a frequency shift key decoder circuit) using the arrangement of memristors shown in FIG. 5 to perform the functions of a frequency shift key decoder.

FIG. 11 illustrates one embodiment of a signal-processing device 1190 (a frequency shift key decoder circuit) using the arrangement of memristors shown in FIG. 5 to perform the functions of a frequency shift key decoder. FIG. 11 is divided into four parts. From left to right, the four parts are (1) the frequency shift key modulation section 1150 that encodes the incoming binary input stream, (2) the FM signal 1152 produced by the frequency shift key modulation section 1150, (3) the arrangement of memristors 1154 that decodes the incoming FM signal, and (4) a post-processing section 1156 that produces the final binary output stream. Note that sections (1), (2), and (4) are well-known in the art.

In section 1150 of FIG. 11, the inputs to frequency modulator 1107 include the output 1108 of binary input stream and the VIN 1104 of the constant-amplitude, constant-frequency carrier frequency generator 1101. Frequency modulator 1107 produces an FM signal 1109 at a constant amplitude of 1 volt RMS.

The section 1152 of FIG. 11 includes the constant-amplitude FM signal 1109. In this embodiment, the discrimination capability of the arrangement of memristors in FIG. 11 is such that an FM signal at 893 Hz (representing, for example, a logical one) can be discriminated from an FM signal at the near-by value of 874 Hz (representing, for example, a logical zero).

The section 1154 of FIG. 11 contains the arrangement of memristors shown in FIG. 5 in that the positive terminal 1118 of a first memristor M1 1110 is coupled at connection point 1131 to the negative terminal 1128 of the second memristor M2 1120 and in that the negative terminal 1119 of the first memristor M1 1110 is coupled at connection point 1132 to the positive terminal 1129 of the second memristor M2 1120. FM signal 1109 is coupled to connection point 1131.

The output 1132 of the arrangement of memristors can be probed at probe point VOUT1 1105.

In this embodiment, the load resistor RLOAD1 1102 is 100Ω; $R_{ON}$=100Ω for both memristors; $R_{OFF}$=100,000Ω for both memristors; and k=$10^6$. The output signal of the circuit of FIG. 11 is at a higher amplitude (e.g., 220 mV peak) at VOUT1 1105 for a lower frequency input (representing, for example, a logical zero) and at a lower amplitude (e.g., 80 mV peak) at VOUT1 1105 for a higher frequency input (representing, for example, a logical one). That is, the arrangement of memristors shown in FIG. 11 successfully decodes the two near-by frequencies (893 Hz versus 874 Hz) and performs the function of a frequency shift key decoder.

The section 1156 of FIG. 11 includes an optional post-processing block 1170 that can create a final inverted square wave output signal VOUT2 1106 having if desired the same high and low amplitude values and the same logic as the original incoming binary input stream. One of the many standard ways by which this can be accomplished is an AM (amplitude modulation) detector. In one embodiment, the load resistor RLOAD2 1104 is 100Ω.

In an embodiment, the signal-processing device 1190 for decoding an input signal includes memristor M1 1110 having a positive terminal 1118 and a negative terminal 1119 as well as memristor M2 1120 having a positive terminal 1128 and a negative terminal 1129. An input terminal 1104 is coupled through frequency modulator 1107 to the positive terminal of M1 1110 and the negative terminal of M2 1120. An output terminal 1105 is coupled to the negative terminal of M1 1110 and the positive terminal of M2 1120. The output amplitude of the device 1190 is, after an initial transitional period, predominantly at a first level if the frequency of the input signal received by the input terminal 1104 is close to a first frequency and the output amplitude is, after an initial transitional period, predominantly at a second level if the frequency of the input signal is close to a second frequency.

In amplitude shift key modulation encoding, a constant-frequency, constant-amplitude carrier signal is modulated by a binary digital input stream (e.g., a square wave that is high when the input signal represents a logical one and is low when the input signal represents a logical zero) to yield a constant-frequency AM signal that encodes the original incoming digital binary data stream.

Figure 12A:
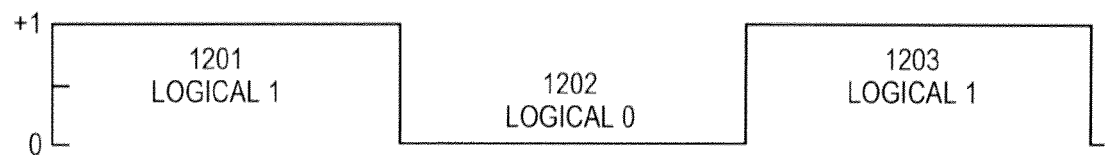
FIG. 12a illustrates a binary input stream in accordance with one embodiment.
Figure 12B:
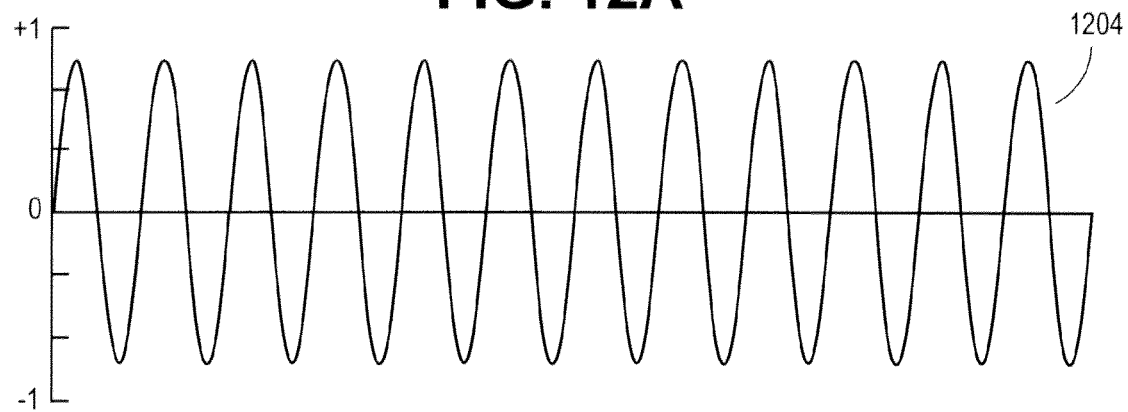
FIG. 12b illustrates a constant-frequency, constant-amplitude carrier in accordance with one embodiment.
Figure 12C:
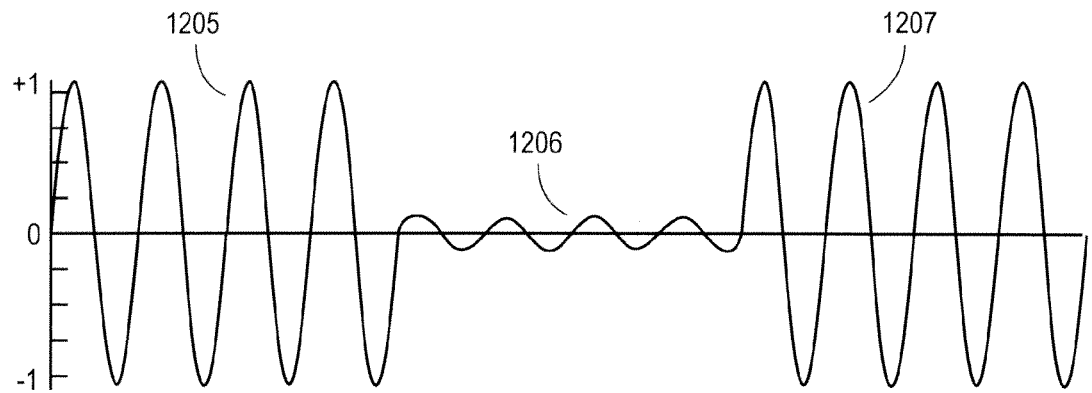
FIG. 12c illustrates amplitude in the encoded amplitude modulation (AM) output signal in accordance with one embodiment.

FIG. 12b illustrates a constant-frequency, constant-amplitude carrier 1204 in accordance with one embodiment. In amplitude shift key modulation encoding, the constant-frequency, constant-amplitude carrier 1204 is changed to one of two different amplitudes depending on the digital binary input stream. FIG. 12a illustrates a binary input stream in accordance with one embodiment. Logical one 1201 in the binary input stream of FIG. 12a is represented, in the digital domain, by a certain amplitude voltage (e.g., +1 Volt). When carrier 1204 is modulated by logical one 1201, the result is a certain, higher in this example, amplitude 1205 in the encoded amplitude modulation (AM) output signal illustrated in FIG. 12c in accordance with one embodiment. When carrier 1204 is modulated by logical zero 1202, the result is a different, lower in this example, amplitude 1206 in the encoded amplitude modulation (AM) output signal. Then, when carrier 1204 is modulated by another logical one 1203, the result is that the amplitude 1207 in the encoded amplitude modulation (AM) output signal is higher. The result is a constant-frequency AM signal that encodes the original incoming digital binary data stream.

Figure 13:
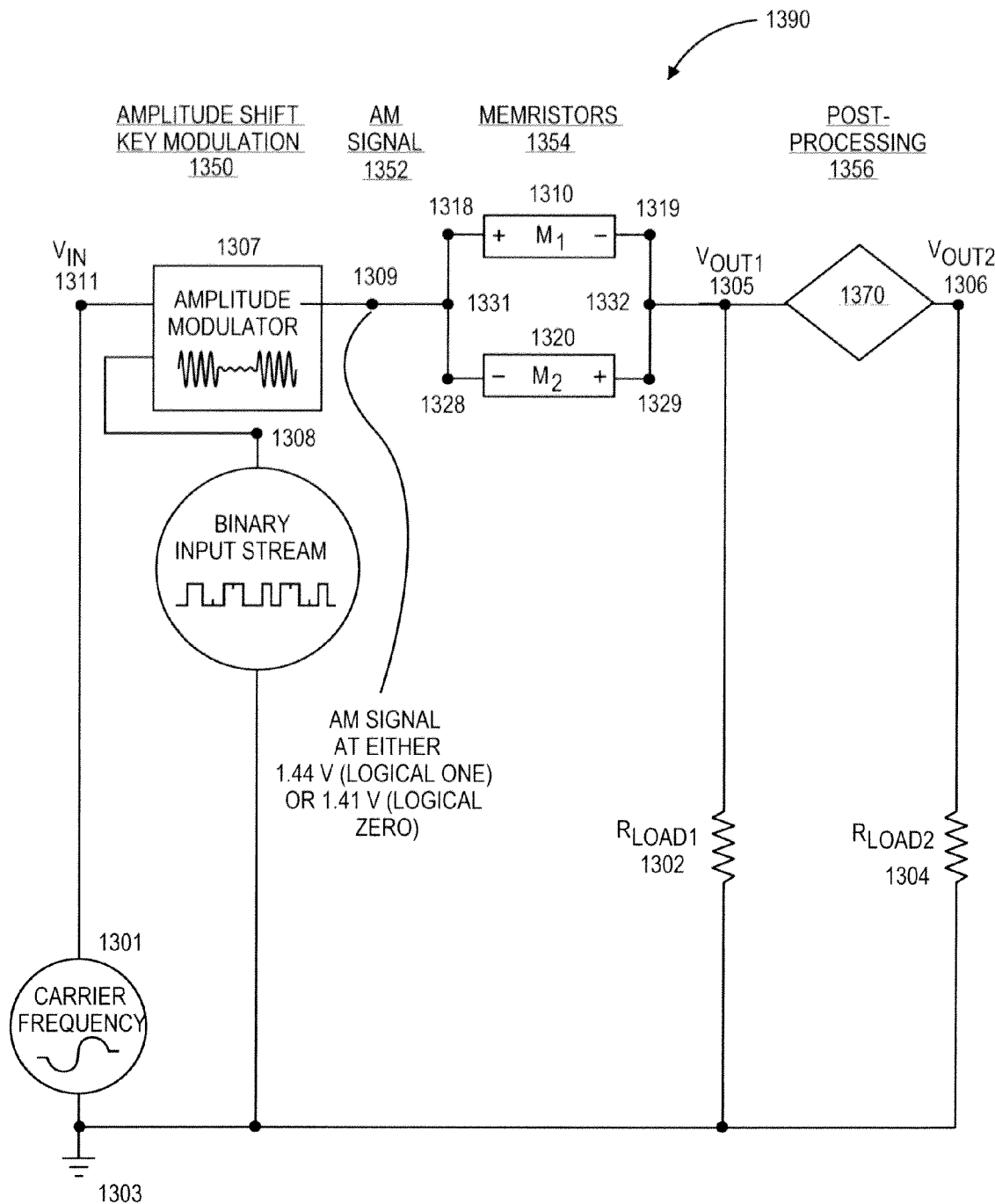
FIG. 13 illustrates a signal-processing device (an amplitude shift key decoder circuit) using the arrangement of memristors shown in FIG. 5 to perform the functions of an amplitude shift key decoder in accordance with one embodiment.

An amplitude shift key decoder can be used to convert an encoded AM signal produced by an amplitude shift key modulation encoding process to a digital binary output stream. FIG. 13 illustrates a signal-processing device 1390 (an amplitude shift key decoder circuit) using the arrangement of memristors shown in FIG. 5 to perform the functions of an amplitude shift key decoder in accordance with one embodiment. FIG. 13 is divided into four parts. From left to right, the four parts are (1) the amplitude shift key modulation encoding section 1350 that encodes the incoming binary input stream, (2) the AM signal 1352 produced by the amplitude shift key modulation section 1350, (3) the arrangement of memristors 1354 that decodes the incoming AM signal, and (4) an optional post-processing section 1356 that produces the final binary output stream.

In section 1350 of FIG. 13, the inputs to amplitude modulator 1307 include the output 1308 of binary input stream and the output 1311 of the constant-amplitude, constant-frequency carrier signal generator 1301. Amplitude modulator 1307 produces an AM signal 1309 at a constant frequency (e.g., 893 Hz in this embodiment).

The section 1352 of FIG. 13 includes the constant-frequency AM signal 1309. In one embodiment, the discrimination capability of the arrangement of memristors in FIG. 13 is such that an AM signal representing a logical one (e.g., 1.44 volts peak) can be successfully discriminated from an AM signal representing a logical zero (e.g., the near-by value of 1.41 volts peak).

The section 1354 includes the arrangement of memristors shown in FIG. 5 in that the positive terminal 1318 of a first memristor M1 1310 is coupled at connection point 1331 to the negative terminal 1328 of the second memristor M2 1320 and in that the negative terminal 1319 of the first memristor M1 1310 is coupled at connection point 1332 to the positive terminal 1329 of the second memristor M2 1320. AM signal 1309 is coupled to connection point 1331.

The output 1332 of the arrangement of memristors can be probed at probe point VOUT1 1305.

In this embodiment, the load resistor RLOAD1 1302 is 100Ω; the load resistor RLOAD2 1304 is 100Ω; $R_{ON}$=100Ω for both memristors; $R_{OFF}$=100,000Ω for both memristors; and k=$10^6$ for both memristors. An output signal of lower amplitude (e.g., 76 mV peak in this embodiment) appears at VOUT1 1305 representing a logical zero and an output signal of a substantially higher and distinct amplitude (e.g., 204 mV peak in this embodiment) appears at VOUT1 1305 representing a logical one. That is, the arrangement of memristors shown in FIG. 13 decodes the two near-by amplitudes (e.g., 1.44 volts versus 1.41 volts).

The section 1356 includes an optional post-processing block 1370 that can create a final square wave output signal VOUT 1309 having if desired substantially the same high and low amplitude values as the original incoming binary input stream 1302.

In an embodiment, the signal-processing device 1390 for decoding an input signal includes memristors M1 1310 and M2 1320. An input terminal 1309 is coupled to the positive terminal of M1 1310 and the negative terminal of M2 1320. An output terminal 1305 is coupled to the negative terminal of M1 1310 and the positive terminal of M2 1320. The output amplitude of the device 1390 is, after an initial transitional period, predominantly at a first level if the amplitude of the input signal received by the input terminal 1311 is close to a first amplitude and the output amplitude is, after an initial transitional period, predominantly at a second level if the amplitude of the input signal is close to a second amplitude.

Figure 14:
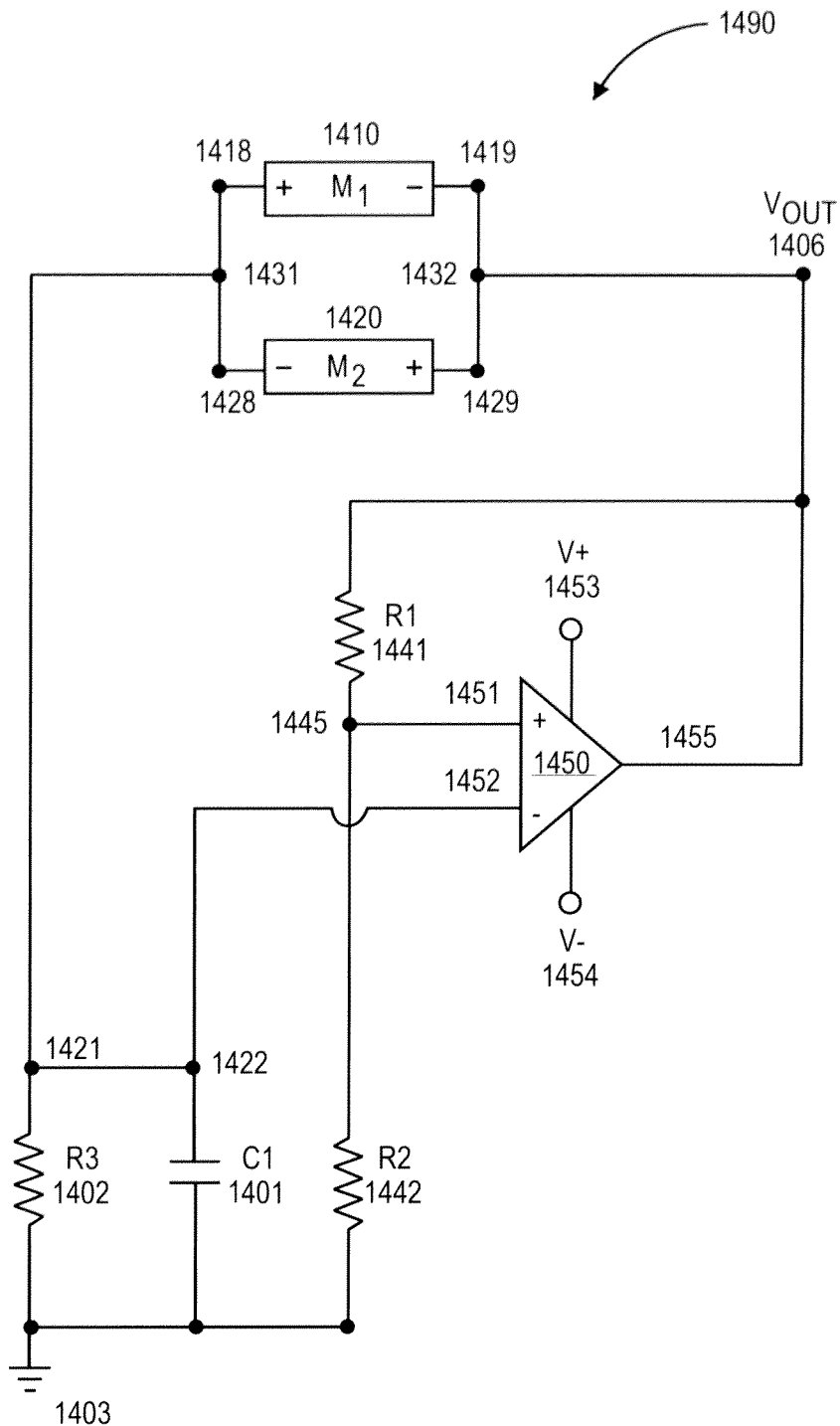
FIG. 14 illustrates a device (an oscillator circuit) having memristors in accordance with one embodiment.

An oscillator is a device for generating a repetitive signal with a fixed periodicity. Oscillators can be constructed using the arrangement of memristors shown in FIG. 5. FIG. 14 illustrates a device 1490 (an oscillator circuit) having memristors in accordance with one embodiment. The circuit of FIG. 14 includes the arrangement of memristors shown in FIG. 5 in that the positive terminal 1418 of a first memristor M1 1410 is coupled at connection point 1431 to the negative terminal 1428 of the second memristor M2 1420 and in that the negative terminal 1419 of the first memristor M1 1410 is coupled at connection point 1432 to the positive terminal 1429 of the second memristor M2 1420.

In one embodiment, the device 1490 is an oscillator that generates a repetitive signal with a fixed periodicity. An output terminal 1406 is coupled to the negative terminal of M1 1410 and the positive terminal of M2 1420. The device includes a gain element (e.g., operational amplifier 1450) having an output 1455 that is coupled to the output terminal. The period of the oscillation is based on the time it takes for the memristance of memristors M1 1410 and M2 1420 to transition from their respective maximum memristance values to their respective minimum memristance values.

In one embodiment, the signal-processing device 1490 operates in one of multiple states including a first unstable state and a second unstable state. The device 1490 includes M1 1410 and M2 1420 as discussed above. A first period of time in the first unstable state is determined by a first transition time of the M1 1410 from a first memristance value to a second memristance value. A second period of time in the second unstable state is determined by a second transition time of M2 1420 from a third memristance value to a fourth memristance value. The device switches between the two states recurrently.

In a specific embodiment, the first memristance value is the maximum memristance of M1 1410, the second memristance value is the minimum memristance of M1 1410, the third memristance value is the maximum memristance of M2 1410, and the fourth memristance is the minimum memristance value of M2 1420.

The first period of time in the first unstable state is inversely proportional to a first voltage and the second period of time in the second unstable state is inversely proportional to a second voltage. In one embodiment, the first and second voltages (i.e., V+ 1453, V− 1454) are substantially equal in magnitude and of opposite sign producing a symmetric output signal at VOUT 1406. The frequency of this output signal is proportional to the common magnitude of the two voltages.

In the embodiment of an oscillator employing memristors arranged as shown in FIG. 14, the oscillator's output VOUT 1406 is connected to the connection point 1432 at which the negative terminal 1419 of the first memristor M1 1410 is coupled to the positive terminal 1429 of the second memristor M2 1420.

This same connection point 1432 is, in this embodiment, coupled to the output 1455 of gain element 1450. In this embodiment, the gain element is a high-speed operational amplifier with a positive voltage source of +15 volts at V+ 1453 and a negative voltage source of −15 volts at V− 1454. In addition, this same connection point 1432 is, in this embodiment, coupled at 1445, through resistor R1 1441, to the operational amplifier's positive input terminal 1451. Connection point 1445 is also coupled to ground 1403 through resistor R2 1442.

Connection point 1431 is coupled to the operational amplifier's negative input terminal 1452. In addition, connection point 1431 is coupled to ground 1403 via a parallel arrangement of resistor R3 1402 and capacitor C1 1401. Note that capacitor C1 1401 is a "pulse-stretcher" to accommodate the finite slew-rate of the operational amplifier and is not a timing component.

In this embodiment, $k=u_v/D^2=100,000$ for both memristors; the resistance of resistor R1 1441 is 10 kΩ; the resistance of resistor R2 1442 is 1 kΩ; the resistance of resistor R3 1402 is 300Ω; the capacitance of capacitor C1 1401 is 20 nF; $R_{ON}$ is 100Ω for both memristors; and $R_{OFF}$ is 100,000Ω for both memristors. The circuit of FIG. 14 generates a square wave of frequency 1,288 Hz. The frequency of oscillation of the circuit in FIG. 14 is determined by the characteristics of its memristors.

Recall the earlier definition that x(t)=w(t)/D and that $k=u_v/D^2$ where $u_v$ is ion mobility.

For the purposes below, define $r=R_{OFF}/R_{ON}$ for a memristor whose maximum resistance is $R_{OFF}$ and whose minimum resistance is $R_{ON}$. In addition, define $\rho=(r+1)/2k$. Let $T_{ab}$ be the elapsed time that it takes for a memristor to make the transition from a state of $x=a$ to a state of $x=b$ (where $0 \le a \le b \le 1$) when a fixed voltage, V, is applied to the memristor. $T_{ab}$ is ascertained as follows. Recall that the memristance of a memristor is $$M(w(t)) = R_{ON}\frac{w(t)}{D} + R_{OFF}\left(1 - \frac{w(t)}{D}\right).$$

Making the substitution $x(t)=w(t)/D$, the memristance of a memristor is then $$M(x(t)) = x(t)R_{ON} + R_{OFF}[1 - x(t)]$$
$$= R_{ON}\{x(t) + r[1 - x(t)]\}.$$

The differential equation describing the state of a memristor with applied voltage $V(t)$ is $$dx(t)/dt = kR_{ON}i(t)$$
$$= kR_{ON}V(t)/M(x(t))$$
$$= kV(t)/[x(t) + r(1 - x(t))].$$

A solution for this differential equation (for a fixed applied voltage V and initial conditions of $x(0)=0$) is $$x(t) = [r - \sqrt{r^2 - 2ktV(r-1)}]/(r-1).$$

As previously discussed, $\rho=(r+1)/2k$. For the special case of $x(t)=w(t)/D=1$ (that is, the point when the memristor reaches its minimal memristance $R_{ON}$), the above equations are solved for $T_{01}$ (the time of transition from $x=0$ to $x=1$).

$$T_{01} = (1+r)/2kV = \rho/V.$$

When $r \gg 1$, $r-1 \sim r \sim r+1$, and using $2kV/(r-1) \approx 1/T_{01}$, $$x(t) \approx 1 - \sqrt{1 - t/T_{01}}.$$

Solving for the time $T(x)$, when the memristor has a state of x results in $$T(x) = [1 - (1-x)^2]T_{01} = x(2 - T_{01}).$$

The general formula for $T_{ab}$ (where $0 \le a \le b \le 1$) is $$T_{ab} = T_b - T_a = (b(2-b) - a(2-a))T_{01} = (b-a)(2-a-b)T_{01}.$$

For $b=1$ (used below), this reduces to $T_{a1} = (1-a)^2 T_{01}$.

Note that many relatively low frequencies can be obtained. For some purposes, it is useful to define the switch-on time for a memristor as the time that it takes the memristance to move down an order of magnitude from $10R_{ON}$ to $R_{ON}$. In order to use the above formula from paragraph [00155] to calculate this time, the state, $x_{10*Ron}$, is needed when the memristor resistance has been reduced to $10 R_{ON}$. The state, $x_{Ron}$ when the memristor resistance$=R_{ON}$ is $x_{Ron}=1$.
Then, the equation relating the state to memristor resistance for $x_{10*Ron}$ is solved.

$$R_{ON}(r(1-x) + x) = 10R_{ON}$$

giving $$x_{10*Ron.} = (r-10)/(r-1).$$

and using the formula from paragraph [00155] the transition time from $10 R_{ON}$ to $R_{ON}$ is $$T[x_{10*Ron1}] = T_{01}(1 - x_{10*Ron})^2 = T_{01}(10-1)^2/(r-1)^2$$

$$T_{switch-on} \approx T_{01}10^2/r^2.$$

In one embodiment, $r=1,000$ and $T_{switch-on}=0.0001T_{01}$.

A detailed description of a single cycle of operation of the oscillator of FIG. 14 follows.

The precise behavior of the oscillator of FIG. 14 depends on three parameters of the operational amplifier 1450, namely the output current limit, equal to approximately 25 milliamperes in this embodiment; the positive slew rate Slew-Positive, equal to 15 volts per microsecond in this embodiment; and the negative slew rate Slew-Negative, equal to 22 volts per microsecond in this embodiment.

$V_{max}$ denotes the maximum difference between the voltage at VOUT 1406 and the voltage at point 1421, and $V_{min}$ denotes the minimum difference between these two voltages. In this embodiment, $V_{max}$ equals 12.92 volts and $V_{min}$ equals −12.92 volts.

The voltage at which the output stage of operational amplifier 1450 switches from current limiting to slew rate limiting is equal to the product of two quantities: the output current limit of 25 milliamperes, and the minimum memristance of memristors 1410 and 1420, namely $R_{ON}$ (equal to 100Ω in this embodiment). The product of these two quantities is 2.5 volts in this embodiment.

Figure 15:
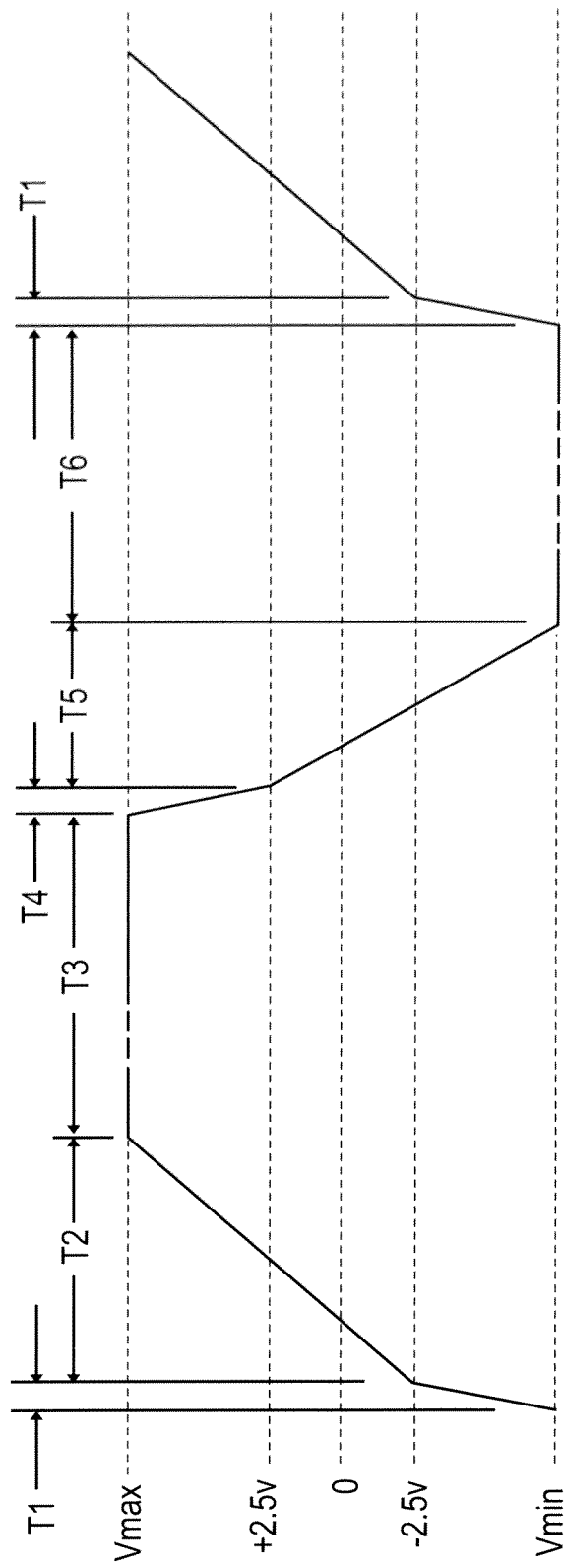
FIG. 15 illustrates the voltage difference across a parallel arrangement of memristors as a function of time in accordance with one embodiment.

FIG. 15 illustrates the voltage difference across the parallel arrangement of memristors (i.e., the difference between the voltage at point 1421 and the voltage at VOUT 1406 of FIG. 14) as a function of time in accordance with one embodiment. Each cycle of oscillation, after the first cycle, includes six time segments.

At the start of T1, memristor M1 1410 has a resistance of 10 $R_{ON}$ and its resistance is decreasing. This is the resistance used to define $T_{switch-on}$, so during the first segment, the memristor M1 1410 switches on. The first segment lasts for time T1=$T_{switch-on}$, which is less than 40 nanoseconds in this embodiment. During the second segment, the voltage across the parallel arrangement of memristors increases from −2.5 volts to its maximum value of $V_{max}$. The rate at which the voltage across the parallel arrangement of memristors can change is limited by the positive slew rate Slew-Positive of operational amplifier 1450. Thus, the time T2 required for the voltage to increase from −2.5 volts to $V_{max}$ equals ($V_{max}$+2.5 volts)/Slew-Positive, or 1.03 microseconds in this embodiment.

During the third segment, the memristance of memristor M2 1420 decreases from approximately $R_{OFF}$ to approximately $10 R_{ON}$. This takes time T3=$T_{01}=\rho/V_{max}$, which is 387.4 microseconds in this embodiment. During the fourth segment, memristor M2 1420 switches on. This takes time T4=$T_{switch-on}$, which, as previously mentioned, is less than 40 nanoseconds in this embodiment.

During the fifth segment, the voltage across the parallel arrangement of memristors decreases from 2.5 volts to its minimum value of $V_{min}$. The rate at which the voltage across the parallel arrangement of memristors changes is limited by the negative slew rate, Slew-Negative, of operational amplifier 1450. Thus, the time T5 required for the voltage to decrease from 2.5 volts to $V_{min}$ equals (2.5 volts−$V_{min}$)/Slew-Negative, or 0.7 microseconds in this embodiment.

During the sixth segment, the memristance of memristor M1 1410 decreases from approximately $R_{OFF}$ to approximately $10 R_{ON}$. This takes time T6=$T_{01}=\rho/|V_{min}|$, which is 387.4 microseconds in this embodiment.

The period P of the oscillator equals T1+T2+T3+T4+T5+T6, or 776.5 microseconds in this embodiment. The frequency of the oscillator is thus 1/P=1288 Hz.

Table 13 shows the frequency of the oscillator of FIG. 14 for various choices of k (given that $r=R_{OFF}/R_{ON}=1,000$ in this embodiment). Table 13 shows both the theoretical frequency, derived using the equations in this section, as well as the results of SPICE simulations. As can be seen, the theory agrees well with the results of the SPICE simulations.

TABLE 13

Oscillator frequencies as a function of k

| k | Theoretical period | Theoretical frequency | Simulation frequency |
|---|---|---|---|
| 10 | 7.748E+00 | 0.129 | 0.1292 |
| 100 | 7.748E−01 | 1.291 | 1.293 |
| 1,000 | 7.748E−02 | 12.9 | 12.90 |
| 10,000 | 7.749E−03 | 129.0 | 129 |
| 100,000 | 7.765E−04 | 1,288 | 1,287 |
| 1,000,000 | 7.921E−05 | 12,625 | 12,710 |
| 10,000,000 | 9.478E−06 | 105,511 | 106,000 |

The period, P, of the oscillator can be expressed as a function of $V_{max}$ and $V_{min}$, controllable by the user of the circuit, and by $\rho=(r+1)/2k$, a parameter of the memristors that is controllable by the designer of the circuit. Ignoring the negligible terms, T1 and T4, the period is equal to the sum of the following three terms:

$$(V_{max}+2.5 \text{ volts})/\text{Slew}_+ + (V_{min}-2.5 \text{ volts})/\text{Slew-Negative} + \rho(1/V_{max}+1/|V_{min}|).$$

In many applications, as in the above example, the first two slew-rate-dependent, terms are negligible compared to the final two terms, leading to a circuit having a period that is essentially inversely proportional to the voltages $V_{max}$ and $V_{min}$. Thus, the frequency of the circuit is proportional to $V_{max}$ and $V_{min}$. In the next section, this result is used to design a voltage-controlled oscillator having an output frequency that is proportional to the controlling voltages.

Figure 16:
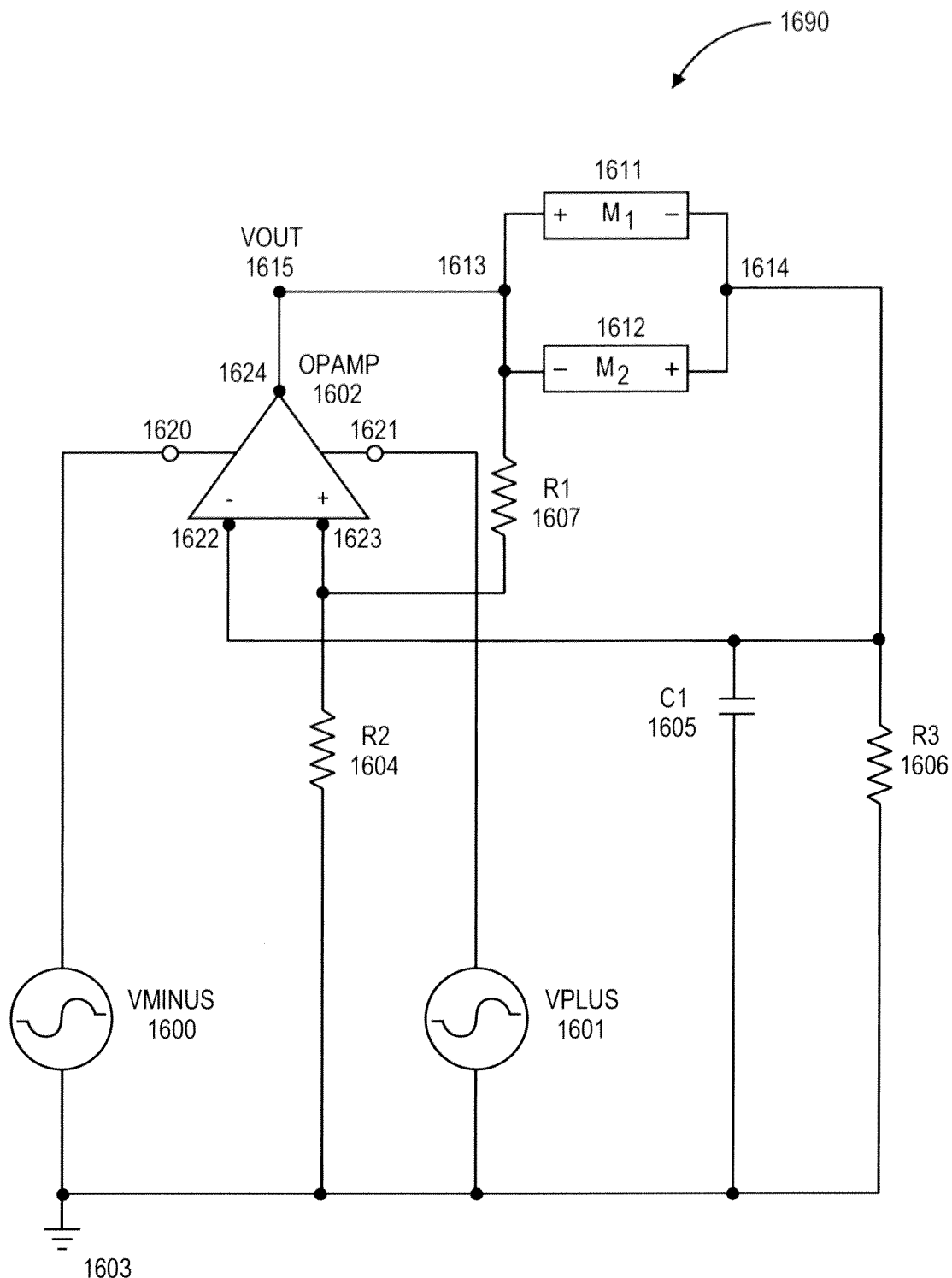
FIG. 16 illustrates a signal-processing device (a voltage-controlled oscillator circuit) having memristors in accordance with one embodiment.

A voltage-controlled oscillator may be constructed using the arrangement of memristors shown in FIG. 5. FIG. 16 illustrates a signal-processing device 1690 (e.g., voltage-controlled oscillator circuit) having memristors in accordance with one embodiment. The circuit of FIG. 16 includes the arrangement of two memristors shown in FIG. 5. FIG. 16 includes an operational amplifier OPAMP 1602. Voltage source VMINUS 1600 is coupled to the negative power supply terminal 1620 of OPAMP 1602. Voltage source VPLUS 1601 is coupled to the positive power supply terminal 1621 of OPAMP 1602. The positive input 1623 of OPAMP 1602 is coupled through resistor R2 1604 to ground 1603. The negative input 1622 of OPAMP 1602 is coupled to ground 1603 via a parallel arrangement of capacitor C1 1605 and resistor R3 1606. The output 1624 of OPAMP 1602 is coupled to VOUT 1615. VOUT 1615 is coupled at point 1613 to a parallel arrangement of memristors M1 1611 and M2 1612. This parallel arrangement of memristors is also coupled at point 1614 to the negative input 1622 of OPAMP 1602. Point 1613 is coupled via resistor R1 1607 to the positive input 1623 of OPAMP 1602. Note that in this figure (and others herein), if two wires cross, they are not connected; however, if two wires cross with a large dot, they are connected.

The circuit of FIG. 16 includes the arrangement of memristors shown in FIG. 5 in that the positive terminal of a first memristor M1 1611 is coupled at connection point 1613 to the negative terminal of a second memristor M2 1612 and in that the negative terminal of the first memristor M1 1611 is coupled at connection point 1614 to the positive terminal of the second memristor M2 1612.

In an embodiment, the device 1690 includes a first voltage source (e.g., VMINUS 1600), a second voltage source (e.g., VPLUS 1601), and a gain element (e.g., operational amplifier 1602) having a positive power supply terminal and a negative power supply terminal with the first voltage source being coupled to the positive power supply terminal of the gain element and the second voltage source being coupled to the negative power supply terminal of the gain element. The positive terminal of the first memristor (e.g., M1 1611) and the negative terminal of the second memristor (e.g., M2 1612) of the device are both coupled to an output terminal (e.g., 1624) of the operational amplifier.

The negative terminal of the first memristor M1 and the positive terminal of the second memristor M2 of the device are coupled to ground via a parallel arrangement of a resistor and a capacitor. The device 1690 is a voltage controlled oscillator for generating a repetitive signal having an amplitude that is controlled by the difference in voltage between two input signals of the gain element.

For purposes of illustrating the operation of one embodiment of the circuit of FIG. 16, the resistance of R1 1607 is 9 kΩ; the resistance of R2 1604 is 1 kΩ; the resistance of R3 1606 is 200Ω; the capacitance of C1 1605 is 1 nF; $R_{ON}=100\Omega$ for both memristors; $R_{OFF}=100,000\Omega$ for both memristors; and $k=2*10^6$ for both memristors. Voltage source VPLUS 1601 supplies a 1 kHz sine wave voltage signal whose amplitude is 2.5 volts and whose DC offset is 9.5 volts. Thus, the voltage ranges from a low of 7 volts to a high of 12 volts. Voltage source VMINUS 1600 supplies a 1 kHz sine wave voltage signal having an amplitude of 2.5 volts and a DC offset of −9.5 volts. Thus, the voltage ranges from a low of −12 volts to a high of −7 volts. In this embodiment, OPAMP 1602 is an operational amplifier with behavior that is modeled by the OP16G SPICE model.

In this embodiment, the voltage at terminal VOUT 1615 is a square wave with an amplitude that varies with time. At any given time, the square wave's maximum value is approximately 2 volts less than the voltage supplied by voltage source VPLUS 1601, and the square wave's minimum value is approximately 2 volts greater than the voltage supplied by voltage source VMINUS 1600. The amplitude of the square wave at any given time is thus approximately 4 volts less than the difference between the voltage output by voltage source VPLUS 1601 and the voltage output by voltage source VMINUS 1600. The frequency of the square wave is approximately proportional to the common magnitude of the two voltage sources. The circuit of FIG. 16 thus acts as a voltage-controlled oscillator in that it produces as output a square wave with an amplitude and frequency that is controlled by the voltage output by voltage source VPLUS 1601 and the voltage output by voltage source VMINUS 1600. For these values of the memristor parameters, the output voltage amplitude varies from about 10 Volts peak to peak to 20 Volts peak to peak and the frequency varies from about 10 kHz to about 21 kHz.

If desired, the frequency of voltage sources VMINUS and VPLUS may be controlled by a single common voltage source (not shown in FIG. 16). One way in which this can be done is by using operational amplifiers to amplify the voltage of the single common voltage source and to change its DC offset. This technique is well known in the art. If the voltage sources VPLUS and VMINUS are controlled in this manner, the circuit of FIG. 16 produces a square wave with an amplitude and frequency that are modulated by the single common voltage source.

A monostable multivibrator is a circuit with the following characteristics. The circuit has a single stable state. The circuit may be driven from this single stable state to an unstable state by applying a trigger pulse at a specific point in the circuit. The circuit then remains in the unstable state for a fixed amount of time before returning to the stable state.

Figure 17:
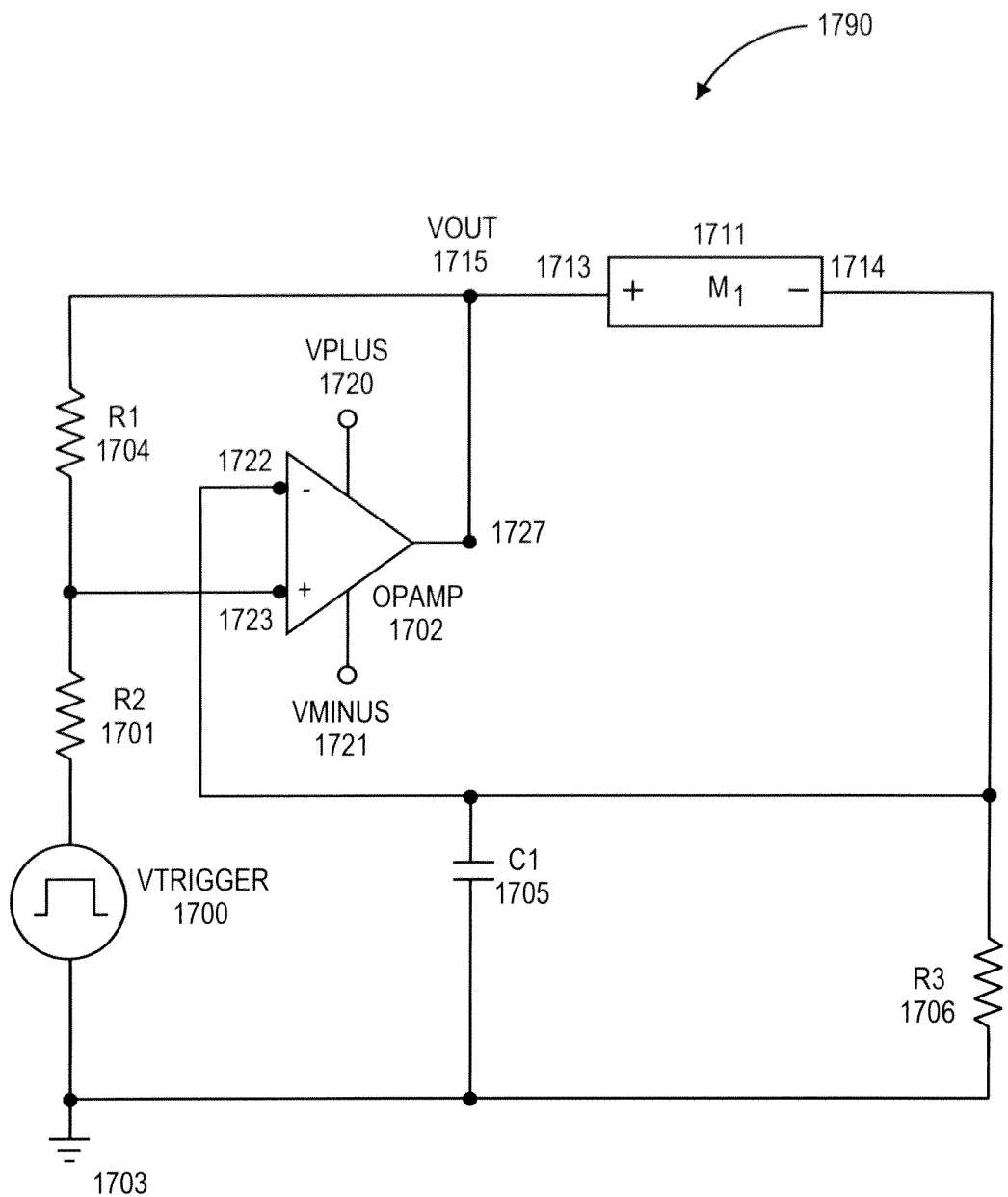
FIG. 17 illustrates a signal-processing device (a monostable multivibrator circuit) having a memristor in accordance with one embodiment.

FIG. 17 illustrates a signal-processing device 1790 (a monostable multivibrator circuit) having a memristor in accordance with one embodiment. In this figure, a trigger (that is, a trigger pulse) is provided by voltage source VTRIGGER 1700. The device 1790 includes an operational amplifier OPAMP 1702. Voltage source VPLUS 1720 is coupled to the positive power supply of OPAMP 1702. Voltage source VMINUS 1721 is coupled to the negative power supply of OPAMP 1702. The positive input 1723 of OPAMP 1702 is coupled through resistor R2 1701 to voltage source VTRIGGER 1700. Voltage source VTRIGGER 1700 is in turn coupled to ground 1703. The negative input 1722 of OPAMP 1702 is coupled to ground 1703 via a parallel arrangement of capacitor C1 1705 and resistor R3 1706. The output 1727 of OPAMP 1702 is coupled to VOUT 1715. VOUT 1715 is coupled to the positive terminal 1713 of memristor M1 1711. The negative terminal of memristor M1 1711 is coupled to the negative input 1722 of OPAMP 1702. VOUT 1715 is coupled via resistor R1 1704 to the positive input 1723 of OPAMP 1702.

In an embodiment, a signal-processing device 1790 operates in one of multiple states including a stable state and an unstable state. The device 1790 includes a memristor (e.g., M1 1711) and an active element (e.g., operational amplifier OPAMP 1702) coupled to the memristor. The memristor transitions from a first memristance value to a second memristance value over a period of time in response to the device entering the unstable state due to the application of a trigger pulse. The device is in the unstable state over the period of time until reaching the stable state. The active element has two input terminals (e.g., 1722, 1723) and an output terminal (e.g., 1727) with the positive terminal of the memristor being coupled to the output terminal and the negative terminal of the memristor being coupled to one of the input terminals of the active element. The period of time that the device remains in the unstable state is approximately equal to the time that is required for the memristance of the memristor to transition from a first memristance value to a second memristance value. The period of time in the unstable state is inversely proportional to a control voltage, the maximum positive output voltage in this case. This maximum positive output voltage is equal to the positive supply voltage minus about 2 volts here.

For purposes of illustrating the operation of one embodiment of the circuit 1790, the resistance of R1 1704 is 9 kΩ; the resistance of R2 1701 is 1 kΩ; the resistance of R3 1706 is 200Ω; the capacitance of C1 1705 is 1 nF; and the parameters of memristor M1 1711 are $R_{ON}$=100Ω, $R_{OFF}$=100,000Ω, and k=$10^6$. Voltage source VPLUS 1720 supplies a constant voltage of +15 volts. Voltage source VMINUS 1721 supplies a constant voltage of −15 volts. OPAMP 1702 is an operational amplifier whose behavior is modeled by the OP16G SPICE model. Voltage source VTRIGGER 1700 emits a 2 volt pulse having a width of 3 microseconds.

Specifically, the voltage output by VTRIGGER 1700 is approximately 0 volts for the first 1 microsecond; the voltage output by VTRIGGER 1700 is approximately 2 volts for the next 3 microseconds; and the voltage output by VTRIGGER 1700 is approximately 0 volts thereafter.

In this embodiment, the circuit 1790 of FIG. 17 behaves as follows. Let $R_{MEM}$ denote the memristance of memristor M1 1711 at a particular point in time. Prior to the arrival of the trigger, the voltage at the negative terminal 1714 of memristor M1 1711 is equal to the voltage at VOUT 1715 times $R3/(R3+R_{MEM})$. Also, at any time, the voltage at the positive input 1723 of OPAMP 1702 is equal to the sum of two quantities: the voltage output by VTRIGGER 1700, and the product of R2/(R1+R2) times the difference between the voltage at VOUT 1715 and the voltage output by VTRIGGER 1700. In this embodiment, R2/(R1+R2)=1/10. Thus, at any time, the voltage at the positive input 1723 of OPAMP 1702 is given by the following equation:

$$V(1723)=VTRIGGER+0.1*(VOUT-VTRIGGER).$$

In this embodiment, VTRIGGER 1700 produces approximately 0 volts output during the first microsecond. During this time, the voltage at VOUT 1715 is at approximately −13 volts, which is the minimum value that can be output by OPAMP 1702 in this embodiment. The voltage at the positive input 1723 of OPAMP 1702 is therefore approximately −1.3 volts. The state variable w/D of memristor M1 1711 is at its initial value of zero, and the memristor's memristance is at its maximum value of 100,000Ω. The voltage at the negative terminal 1714 of memristor M1 1711 and at the negative input 1722 to the op amp is approximately −26 millivolts. As this voltage at the negative (i.e., inverting) input of the opamp is greater than the −1.3 volts at the positive input, the net input voltage is negative and the opamp output will remain at its minimum value. Positive current flows from the negative terminal of M1 1711 to its positive terminal because the voltage at the positive terminal 1713 of memristor M1 1711 is less than the voltage at the negative terminal 1714 of memristor 1711. Thus, the state variable w/D of memristor M1 1711 remains at its initial value of zero. Accordingly, the circuit is in a stable state so long as the voltage output by VTRIGGER 1700 remains at zero.

During the next 3 microseconds, the voltage output by VTRIGGER is 2 volts. In accordance with the above equation, immediately after the voltage at VTRIGGER rises to approximately 2 volts, the voltage at the positive input 1723 of OPAMP 1702 becomes approximately 0.5 volts. At this time, the voltage at the positive input 1723 of OPAMP 1702 exceeds the voltage at the negative input 1722 of OPAMP 1702. The result is that the voltage at VOUT 1715 increases toward its maximum value of approximately 13 volts, at a rate determined by the positive slew rate of operational amplifier OPAMP 1702. Once the voltage at VOUT reaches its maximum value of approximately 13 volts, the voltage at the positive input 1723 of OPAMP 1702 is 3.1 volts, in accordance with the above equation.

Thereafter, the voltage output by VTRIGGER returns to approximately 0 volts. At this time, the voltage at the positive input 1723 of OPAMP 1702 is approximately 1.3 volts, in accordance with the above equation; the voltage at the negative terminal 1714 of memristor M1 1711 is approximately 26 millivolts; and the voltage at VOUT 1715 is approximately 13 volts. Positive current flows from the memristor's positive terminal toward its negative terminal because the voltage at the positive terminal 1713 of memristor M1 1711 exceeds the voltage at its negative terminal 1714. The state variable w/D of memristor M1 1711 thus increases toward 1.

As the state variable w/D of memristor M1 1711 approaches 1, the memristance $R_{MEM}$ of memristor M1 1711 approaches its minimum value of $R_{ON}$. Once $R_{MEM}$ becomes sufficiently small, the operational amplifier OPAMP 1702 cannot supply enough current to maintain the voltage at VOUT 1715, causing the voltage at VOUT 1715 to collapse toward ground. In accordance with the above equation, the voltage at the positive input 1723 of OPAMP 1702 also collapses toward ground.

At the same time, the positive current through memristor M1 1711 (i.e., from its positive terminal to its negative terminal) increases the voltage at the negative input 1722 of OPAMP 1702. Once the voltage at the negative input 1722 of OPAMP 1702 exceeds the voltage at the positive input 1723 of OPAMP 1702, the operational amplifier OPAMP 1702 drives VOUT toward its minimum value of approximately −13 volts. This in turn causes positive current to flow from the negative terminal 1714 of memristor M1 1711 to its positive terminal, restoring the state variable w/D of memristor M1 1711 to its original value of zero. At this point, the circuit is back to its original stable state. The function of C1 during this transition is to hold the negative input of the opamp above that of the positive input of the opamp until the resistance of the memristor has increased to the point that the voltage divider consisting of the memristor and R3 provides less feedback to the negative opamp input than the voltage divider consisting of R1 and R2 provides to the positive input of the opamp. After that point the net positive feedback will maintain the stable state.

Thus, the amount of time that the circuit of FIG. 17 stays in the unstable state, after application of the trigger pulse, depends on the amount of time it takes for the memristance $R_{MEM}$ of memristor M1 1711 to move from its initial value of $R_{OFF}$ to a value close to the minimum possible value, namely, $R_{ON}$. In this embodiment, the circuit remains in the unstable state for approximately 38.5 microseconds. By changing the k parameter of memristor M1 1711, the duration of the period during which the circuit remains in the unstable state can be made shorter or longer.

Models based on the mathematical behavior of memristors permit the simulation of memristor behavior using circuit simulators such as SPICE. SPICE (Simulation Program with Integrated Circuit Emphasis) is a family of programs written over several decades at the University of California at Berkeley for the simulation of analog, digital, and mixed analog/digital electrical circuits.

Figure 18:
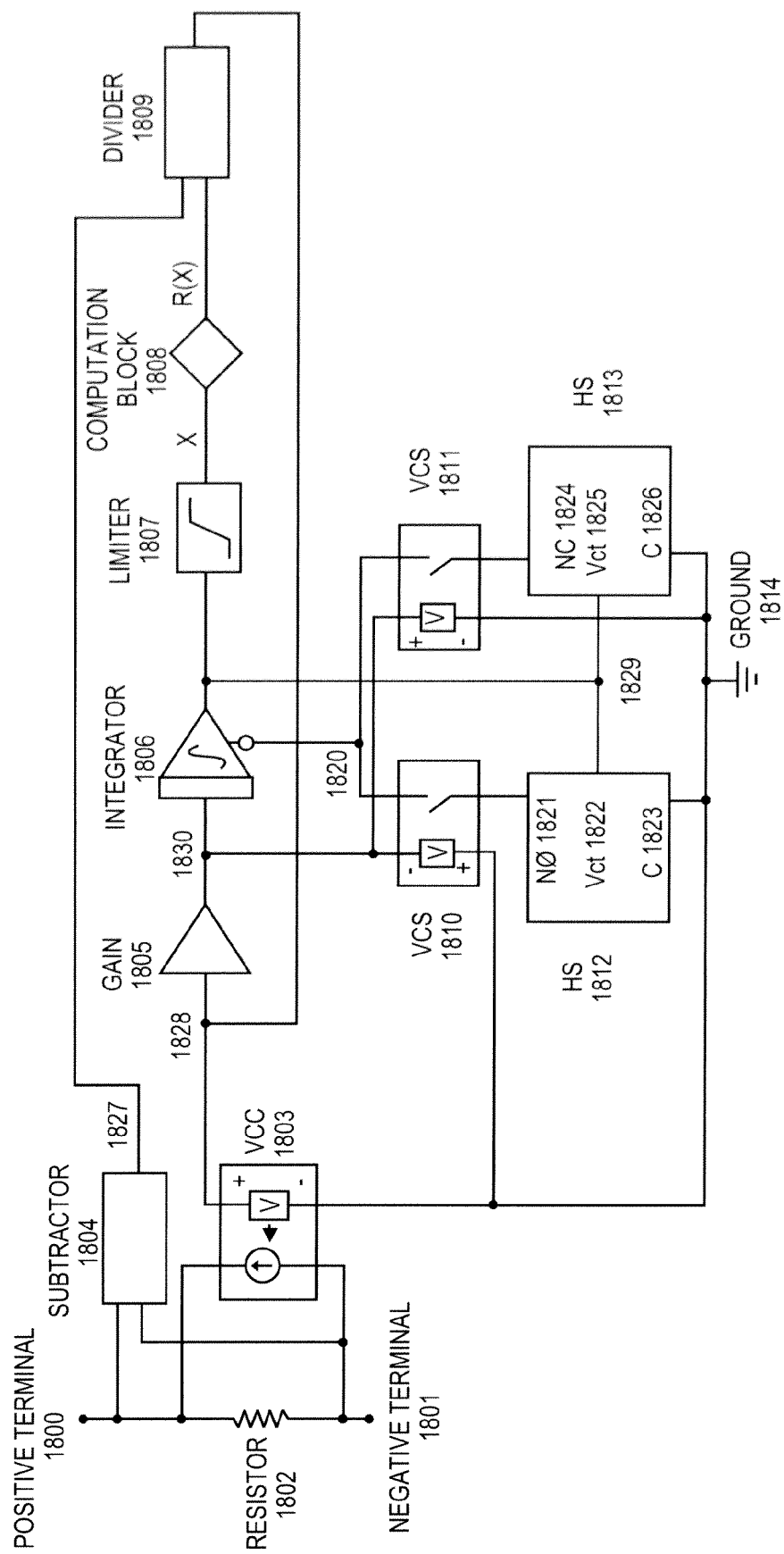
FIG. 18 illustrates a schematic drawing of a model of a memristor in accordance with certain embodiments.

FIG. 18 is a schematic drawing of a model of a memristor in accordance with certain embodiments. The circuitry in FIG. 18 models a two-leaded element (e.g., a memristor) having a memristance that is determined by the time integral of the current that has flowed through the element. Recall that, at any time, the voltage across a memristor is equal to the current through the memristor multiplied by the memristance where the memristance varies with time. The model in FIG. 18 ensures that this relationship between current, voltage, and memristance holds by computing the desired memristance R(x) as a function of the integral of the current through the memristor and producing a current through the memristor equal to the voltage across the memristor divided by the desired memristance R(x).

A memristor model of FIG. 18 is described below. The positive terminal 1800 of the memristor is coupled through resistor 1802 to the memristor's negative terminal 1801. In this embodiment, the resistance of resistor 1802 is approximately 1 Gigaohm. Note that resistor 1802 is required by SPICE and plays no role in the circuit's performance. The current that flows between the memristor's positive terminal 1800 and the memristor's negative terminal 1801 is controlled by voltage-controlled current source VCC 1803. Voltage-controlled current source VCC 1803 produces a current between the positive terminal 1800 and the negative terminal 1801 that is equal to the difference between the voltage at point 1828 and the voltage at ground 1814. That is, VCC 1803 produces an output of 1 amp/volt, so that the output current in amps is equal to the input voltage in volts. Because the voltage at ground 1814 is always zero, the current, in amps, that flows from the positive terminal 1800 of the memristor to the negative terminal 1801 of the memristor is equal to the voltage in volts at point 1828, as voltage-controlled current source 1803 produces 1 amp of current in the output for 1 volt of voltage at point 1828.

The voltage at point 1828 is computed as follows. Subtraction block 1804 produces a voltage at point 1827 equal to the difference between the voltage at the memristor's positive terminal 1800 and the voltage at the memristor's negative terminal 1801. Divider block 1809 takes as input the voltage at point 1827 and the desired memristance, R(x), and then produces as output, at point 1828, a voltage equal to the voltage at point 1827 divided by the desired memristance R(x). Thus, at any time, the current through the memristor equals the voltage at point 1828, which equals the voltage across the memristor (i.e., the difference between the voltage at the memristor's positive terminal 1800 and the voltage at the memristor's negative terminal 1801) divided by the desired memristance R(x).

The desired memristance R(x) is computed as follows. Gain block 1805 multiplies the voltage (equal in value to the memristor current) at connection point 1828 by $u_v R_{ON}/D^2$. Voltage integration block (INTEGRATOR) 1806 produces, at point 1829, a voltage equal to the integral of the voltage at point 1830 over the times at which the integrator is enabled. As discussed in the next paragraph, INTEGRATOR 1806 is selectively enabled whenever connection point 1820 is coupled to GROUND 1814. Voltage limiter (LIMITER) 1807 clips the value of the integral (i.e., the voltage at point 1829) to the range [0, 1], producing as output a voltage equal to the value of the memristor's state variable x=w(t)/D. COMPUTATION BLOCK 1808 takes x as input and produces as output the desired memristance $R(x)=R_{ON}x+R_{OFF}(1-x)$.

The integration block 1806 is switched off when the value of x is close to zero or close to 1. The selective enabling of integration block 1806 is accomplished by means of voltage-controlled switch 1810, voltage-controlled switch 1811, hysteretic switch 1812, and hysteretic switch 1813. The integration block 1806 is enabled if and only if one of two conditions holds, namely (1) the value of x is greater than zero, and the derivative of x with respect to time is negative, or (2) the value of x is less than one, and the derivative of x with respect to time is positive. The blocks 1812 and 1813 are switches, activated by x, that include a small amount of hysterisis to prevent SPICE from rapid cycling in response to very small changes in x. The effect on the circuit's output is negligible.

Specifically, voltage-controlled switch VCS 1810 and hysteretic switch HS 1812 enable the integration block whenever condition (1) holds, while voltage-controlled switch VCS 1811 and hysteretic switch HS 1813 enable the integration block whenever condition (2) holds.

Integration block 1806 is enabled when condition (1) holds in the following way. Integration block 1806 is enabled whenever connection point 1820 is coupled to ground 1814. When x is greater than zero, hysteretic switch 1812 is energized. This causes port NO 1821 of hysteretic switch 1812 to be coupled to port C 1823 of the hysteretic switch. Port C 1823 of the hysteretic switch is in turn coupled to ground 1814. When the derivative of x with respect to time is negative, voltage-controlled switch 1810 is closed (because the voltage at point 1830 is negative), causing connection point 1820 to be coupled to port NO 1821 of hysteretic switch 1812. Thus, when condition (1) holds, connection point 1820 is coupled to ground 1814, thus enabling integrator 1806.

In a similar way, voltage-controlled switch 1811 and hysteretic switch 1813 cause the integration block 1806 to be enabled whenever condition (2) holds. Specifically, whenever the value of x is less than one, hysteretic switch 1813 is un-energized, which causes port NC 1824 of the hysteretic switch to be coupled to port C 1826 of the hysteretic switch. Port C 1826 of the hysteretic switch is, in turn, coupled to ground 1814. When the derivative of x with respect to time is positive, voltage-controlled switch 1811 is closed (because the voltage at point 1830 is positive), causing connection point 1820 to be coupled to port NC 1824 of hysteretic switch 1813. Thus, when condition (2) holds, connection point 1820 is coupled to ground 1814, thus enabling integrator 1806.

Table 14 shows the SPICE netlist for the memristor model discussed herein. In this netlist, line 2 corresponds to VCC 1803,
line 3 corresponds to RESISTOR 1802,
line 4 corresponds to SUBTRACTOR 1803,
line 5 corresponds to DIVIDER 1804,
lines 6-9 correspond to GAIN 1805,
lines 10-18 correspond to INTEGRATOR 1806,
lines 19-25 correspond to LIMITER 1807,
lines 26-36 correspond to COMPUTATION BLOCK 1808,
line 37 corresponds to VCS 1810,
line 38 corresponds to VCS 1811,
lines 39-52 correspond to HS 1812,
lines 53-66 correspond to HS 1813, and
lines 68-85 are definitions of subcircuits referenced earlier in the netlist.

TABLE 14

| SPICE netlist for a model for a memristor |
|---|
| 1 .SUBCKT XMEMLIN 5 6 3 4 |
| 2 GVcIs1#10 5 6 8 0 1 |
| 3 R1#56 6 5 1 G |
| 4 XXM1#8 5 6 35 XSUBV |
| 5 XXM2#9 35 9 8 XDIVV |
| 6 V5#13 18 0 DC 100 |
| 7 R2#63 18 3 1k |
| 8 XM5#12 14 3 30 XMULTV |
| 9 XM8#15 8 30 22 XMULTV |
| 10 R1#58 37 22 1Meg |
| 11 GVcIs1#23 7 0 37 22 1 |
| 12 C1#22 0 7 1 |
| 13 R2#59 0 7 1000Meg |
| 14 XXM1#21 7 0 20 XADDV |
| 15 V2#18 36 0 DC 5 V |
| 16 R3#57 23 36 1k |
| 17 SVcSW1#20 0 37 38 23 SSW |
| 18 V1#19 38 0 DC 0.5 |
| 19 VupLimi#52 21 0 DC 1 |
| 20 VloLim#53 19 0 DC 0 |
| 21 SVcSW1#7 34 21 33 21 SSW |
| 22 SVcSW2#6 19 34 19 33 SSW |
| 23 XXM1#5 20 0 33 XADDV |
| 24 R1#55 33 34 1Gig |
| 25 XXM2#4 34 0 10 XADDV |
| 26 V2#1 11 0 DC 1 |
| 27 R1#62 11 4 1k |
| 28 V4#11 16 0 DC 100k |
| 29 R3#65 16 12 1k |
| 30 XXM1#2 12 4 15 XDIVV |
| 31 V1#3 17 0 DC 100 |
| 32 R4#64 17 13 1k |
| 33 XXM1#54 13 4 14 XDIVV |
| 34 XM7#14 14 15 32 XSUBV |
| 35 XM9#16 32 10 31 XMULTV |
| 36 XXM10#17 31 15 9 XADDV |
| 37 SIlt0#38 23 26 0 22 SSW |

TABLE 14-continued

| SPICE netlist for a model for a memristor |
|---|
| 38 SIgt0#39 23 27 22 0 SSW |
| 39 VXmin#24 24 0 DC 0 |
| 40 VXmin1#25 25 0 DC 0.0001 |
| 41 XXM1#36 24 25 43 XSUBV |
| 42 SVcSW1#34 43 44 41 40 SSW |
| 43 R1#60 44 0 1k |
| 44 V2#28 42 0 DC 1 |
| 45 XXM3#29 20 42 48 XMULTV |
| 46 VK1#33 45 0 DC 6366Meg |
| 47 XXM4#32 48 45 47 XDIVV |
| 48 XXM2#31 47 46 XATANV |
| 49 XXM1#30 46 45 41 XMULTV |
| 50 SVcSW2#27 26 0 41 40 SSW |
| 51 SVcSW3#26 0 39 40 41 SSW |
| 52 XXM1#35 25 44 40 XADDV |
| 53 VXmax1#37 28 0 DC .9998 |
| 54 VXmax1#40 29 0 DC .9999 |
| 55 XXM1#51 28 29 53 XSUBV |
| 56 SVcSW1#49 53 54 50 49 SSW |
| 57 R1#61 54 0 1k |
| 58 V2#43 52 0 DC 1 |
| 59 XXM3#44 20 52 58 XMULTV |
| 60 VK1#48 55 0 DC 6366Meg |
| 61 XXM4#47 58 55 57 XDIVV |
| 62 XXM2#46 57 56 XATANV |
| 63 XXM1#45 56 55 50 XMULTV |
| 64 SVcSW2#42 51 0 50 49 SSW |
| 65 SVcSW3#41 0 27 49 50 SSW |
| 66 XXM1#50 29 54 49 XADDV |
| 67 .ENDS XMEMLIN |
| 68 .SUBCKT XOPIDEAL 1 2 3 |
| 69 EGAIN 3 0 1 2 1E5 |
| 70 .ENDS |
| 71 .SUBCKT XDIVV 1 2 3 |
| 72 BX 3 0 V = V(1)/V(2) |
| 73 .ENDS XDIVV |
| 74 .SUBCKT XADDV 1 2 3 |
| 75 BX 3 0 V = V(1) + V(2) |
| 76 .ENDS XADDV |
| 77 .MODEL SSW SW( ) |
| 78 .SUBCKT XSUBV 1 2 3 |
| 79 BX 3 0 V = V(1) − V(2) |
| 80 .ENDS XSUBV |
| 81 .SUBCKT XMULTV 1 2 3 BX 3 0 V = V(1)*V(2) |
| 82 .ENDS XMULTV |
| 83 .SUBCKT XATANV 1 2 |
| 84 BX 2 0 V = ATAN(V(1)) |
| 85 .ENDS XATANV |

The precise operating parameters and, in particular, the precise boundary characteristics of commercially manufactured memristors that will become available in the near future will, no doubt, vary from the currently available information and currently made assumptions concerning the characteristics of HP Labs' prototype memristors.

Referring to FIG. 5, a voltage difference between connection point 500 and connection point 501 results in a current flowing from connection point 500 to connection point 501. The memristance of the memristors will change as a function of the integral of the current that flows between these two points (until it reaches the maximum or minimum value). As previously mentioned, a memristor's memristance, M(q), is a function of charge $$M(q) = R_{ON} q(t) u_v R_{ON}/D^2 + R_{OFF}[1 - q(t) u_v R_{ON}/D^2]$$

Let $y = q(t) u_v R_{ON}/D^2$.

The relationship between the resistance R and y in the lowpass filter circuit of FIG. 3 is therefore $$R = R_{OFF} + y(R_{ON} - R_{OFF}).$$

However, the circuit of FIG. 3 would still operate as a lowpass filter if, for example, a memristor were manufactured having somewhat different characteristics. Suppose, hypothetically, that the above relationship were quadratic in y. That is, $$R = R_{OFF} + y^2(R_{ON} - R_{OFF}).$$

Given this hypothetical quadratic assumption, Table 15 shows the frequency response of the lowpass filter circuit of FIG. 3 to various frequencies between 1 Hz and 100 kHz. In Table 15, column 1 of the table shows the frequency of VSOURCE 300 (referring to FIG. 3); column 2 shows the RMS value of VOUT 305 in millivolts; and column 3 shows the gain in decibels. As can be seen, lower frequencies are passed and higher frequencies are strongly attenuated (about −44 dB gain). Here we are using the values of RSOURCE, RLOAD, VSOURCE, k, $R_{OFF}$, and $R_{ON}$ from paragraph [0050].

TABLE 15

Frequency response of the lowpass filter with quadratic assumption

| Frequency (Hz) | VOUT (mV) | Gain (dB) |
|---|---|---|
| 1 | 333.4 | 0.00 |
| 3 | 331.7 | −0.04 |
| 10 | 332.9 | −0.01 |
| 33 | 331.0 | −0.06 |
| 100 | 317.5 | −0.42 |
| 333 | 237.0 | −2.96 |
| 1,000 | 2.142 | −43.84 |
| 3,333 | 2.004 | −44.42 |
| 10,000 | 1.993 | −44.47 |
| 33,333 | 1.992 | −44.47 |
| 100,000 | 1.989 | −44.48 |

The arrangement of memristors shown in FIG. 5 can discriminate among two frequencies whenever the integral of current that flows through the memristors for a full half-cycle (a period of constant polarity) in one particular direction for a signal of a first frequency causes a change in the memristors' memristance that is significantly different from the change in the memristors' memristance caused by the integral of current of a signal that flows through the memristors for a full half-cycle in the same direction for a signal of a second frequency.

Figure 19:
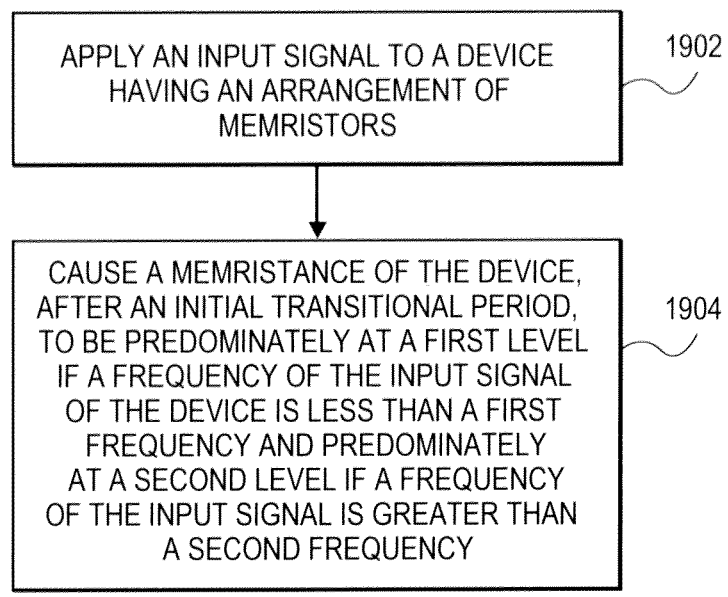
FIG. 19 illustrates a flowchart which represents a process for operating a signal-processing device in accordance with one embodiment.

FIG. 19 illustrates a flowchart which represents a process for operating a signal-processing device in accordance with one embodiment. The process includes applying an input signal (e.g., alternating current) to an arrangement of memristors at processing block 1902. Next, the process includes causing the memristance of the device, after an initial transitional period, to be predominantly at a first level if the frequency of the input signal of the device is less than a first frequency and predominantly at a second level if the frequency of the input signal is greater than a second frequency at processing block 1904.

The arrangement of memristors is illustrated in FIGS. 3 and 5 and includes a first memristor having a positive terminal and a negative terminal and a second memristor having a positive terminal and a negative terminal. The negative terminal of the second memristor is coupled to the positive terminal of the first memristor and the negative terminal of the first memristor is coupled to the positive terminal of the second memristor. The frequency-discrimination capabilities of the arrangement of memristors in FIG. 3 and FIG. 5 arise from the time-domain characteristics of this arrangement of memristors as discussed above.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the present disclosure described herein are, for example, capable of operation in sequences other than those illustrated or otherwise described herein. Similarly, if a method is described herein as comprising a series of operations, the order of such operations as presented herein is not necessarily the only order in which such operations may be performed, and certain of the stated operations may possibly be omitted and/or certain other operations not described herein may possibly be added to the method.

Although present embodiments have been described with reference to specific embodiments, it will be evident that various modifications and changes may be made to these embodiments without departing from the broader spirit and scope of the present embodiments. Accordingly, the specification and drawings are to be regarded in an illustrative rather than a restrictive sense.

What is claimed is:

1. A signal-processing device, comprising:
    a first memristor having a positive terminal and a negative terminal; and
    a second memristor having a positive terminal and a negative terminal with the negative terminal of the second memristor being coupled to the positive terminal of the first memristor, wherein the negative terminal of the first memristor is coupled to the positive terminal of the second memristor.

2. The signal-processing device of claim 1, further comprising:
    an input terminal coupled to the positive terminal of the first memristor and the negative terminal of the second memristor of the device; and
    an output terminal coupled to the negative terminal of the first memristor and the positive terminal of the second memristor of the device.

3. The signal-processing device of claim 1, wherein memristance of the device is, after an initial transitional period, predominantly at a first level if frequency of an input signal of the device is less than a first frequency and predominantly at a second level if the frequency of the input signal is greater than a second frequency.

4. The signal-processing device of claim 2, wherein an output amplitude of the device is, after an initial transitional period, predominantly at a first level if the frequency of an input signal is less than a third frequency and the output amplitude is, after the initial transitional period, predominantly at a second level, if the frequency of the input signal is greater than a fourth frequency.

5. The signal-processing device of claim 3, wherein the second level is substantially lower than the first level of the output amplitude.

6. The signal-processing device of claim 4, wherein the signal-processing device comprises a lowpass filter device.

7. The signal-processing device of claim 1, wherein the device comprises an oscillator to generate a repetitive signal with a fixed periodicity.

8. The signal-processing device of claim 7, further comprising:
    an output terminal coupled to the negative terminal of the first memristor and the positive terminal of the second memristor of the device; and
    a gain element having an output coupled to the output terminal.

9. The signal-processing device of claim 7, wherein a period of the oscillation is based on the time it takes for the memristance of the first memristor and the second memristor to transition from their respective maximum resistance value to their respective minimal resistance value.

10. The signal-processing device of claim 1, further comprising:
a first voltage source;
a second voltage source; and
a gain element having a positive power supply terminal and a negative power supply terminal with the first voltage source being coupled to the positive power supply terminal and the second voltage source being coupled to the negative power supply terminal of the gain element, wherein the positive terminal of the first memristor and the negative terminal of the second memristor of the device are coupled to an output terminal of the gain element.

11. The signal-processing device of claim 10, wherein the negative terminal of the first memristor and the positive terminal of the second memristor of the device are coupled to ground via a parallel arrangement of a resistor and a capacitor.

12. The signal-processing device of claim 11, wherein the device comprises a voltage controlled oscillator for generating a repetitive signal having an amplitude that is controlled by the difference in voltage between two input signals of the gain element.

13. A signal-processing device, comprising:
a first memristor having a positive terminal and a negative terminal; and
a second memristor having a positive terminal and a negative terminal with the negative terminal of the second memristor and the positive terminal of the first memristor being coupled, wherein the negative terminal of the first memristor and the positive terminal of the second memristor are coupled so as to shunt current around a load.

14. The signal-processing device of claim 13, wherein an output amplitude of the device is, after an initial transitional period, predominantly at a first level if frequency of an input signal is less than a first frequency and at a second level if the frequency of the input signal is greater than a second frequency.

15. The signal-processing device of claim 14, wherein the second level is substantially higher than the first level.

16. The signal-processing device of claim 13, wherein the signal-processing device comprises a highpass filter device.

17. A signal-processing device, comprising:
a first arrangement of memristors to generate a first output signal, the first arrangement of memristors comprising:
a first memristor having a positive terminal and a negative terminal, and
a second memristor having a positive terminal and a negative terminal with the negative terminal of the second memristor being coupled to the positive terminal of the first memristor, wherein the negative terminal of the first memristor is coupled to the positive terminal of the second memristor; and
a second arrangement of memristors to generate a second output signal, the second arrangement of memristors comprising:
an arrangement of a third memristor and a fourth memristor.

18. The signal-processing device of claim 17, wherein the first arrangement of memristors comprises a first filter device and the second arrangement of memristors comprises a second filter device.

19. The signal-processing device of claim 18, wherein the first output signal is fed in a series cascade into the second filter device and the output of the signal-processing device is the first or second output signal.

20. The signal-processing device of claim 18, wherein an output amplitude of the device is, after an initial transitional period, predominantly at a first level if frequency of an input signal of the device is less than a first frequency, predominantly at a second level if the frequency of the input signal is between a second and third frequency, and predominantly at a third level if the frequency of the input signal is greater than a fourth frequency.

21. A signal-processing device, comprising:
a first filter device to generate a first signal, the first filter device comprising:
a first memristor having a positive terminal and a negative terminal, and
a second memristor having a positive terminal and a negative terminal with the negative terminal of the second memristor being coupled to the positive terminal of the first memristor, wherein the negative terminal of the first memristor is coupled to the positive terminal of the second memristor; and
a second filter device coupled to the first filter device, the second filter device to generate a second signal, the second filter device comprising an arrangement of a third memristor and a fourth memristor.

22. The signal-processing device of claim 21, wherein the first filter device and the second filter device form a parallel arrangement, and an output of the signal-processing device is based on the first and second signals.

23. The signal-processing device of claim 21, wherein an output amplitude of the device is, after an initial transitional period, predominantly at a first level if frequency of an input signal of the device is less than a first frequency, predominantly at a second level if the frequency of the input signal is between a second and third frequency, and predominantly at a third level if the frequency of the input signal is greater than a fourth frequency.

24. The signal-processing device of claim 21, wherein the first filter device is a lowpass filter device and the second filter device is a highpass filter device, which in combination form a crossover filter device.

25. A signal-processing device for decoding an input signal, comprising:
a first memristor having a positive terminal and a negative terminal;
a second memristor having a positive terminal and a negative terminal;
an input terminal coupled to the positive terminal of the first memristor and the negative terminal of the second memristor of the device; and
an output terminal coupled to the negative terminal of the first memristor and the positive terminal of the second memristor of the device.

26. The signal-processing device of claim 25, wherein an output amplitude of the device is, after an initial transitional period, predominantly at a first level if frequency of an input signal received by the input terminal is close to a first frequency and the output amplitude is, after an initial transitional period, predominantly at a second level if the frequency of the input signal is close to a second frequency.

27. The signal-processing device of claim 25, wherein an output amplitude is, after an initial transitional period, predominantly at a third level if the amplitude of an input signal received by the input terminal is close to a first amplitude and the output amplitude is, after an initial transitional period, predominantly at a fourth level if the amplitude of the input signal is close to a second amplitude.

28. A signal-processing device operating in one of a plurality of states including a stable state and an unstable state, comprising:
 a memristor; and
 an active element coupled to the memristor, wherein the memristor transitions from a first resistance value to a second resistance value over a period of time in response to the device entering the unstable state due to a trigger, the device being in the unstable state over the period of time until reaching the stable state.

29. The signal-processing device of claim 28, wherein the active element has two input terminals and an output terminal with a positive terminal of the memristor being coupled to the output terminal and a negative terminal of the memristor being coupled to one of the inputs terminals of the active element.

30. The signal-processing device of claim 28, wherein the period of time that the device remains in the unstable state is approximately equal to the time for the memristance of the memristor to transition from a first resistance value to a second resistance value.

31. The signal-processing device of claim 28, wherein the positive terminal of the memristor and one of the input terminals of the active element both receive the trigger.

32. The signal-processing device of claim 28, wherein the first period of time is inversely proportional to a control voltage.

33. A signal-processing device operating in one of a plurality of states including a first unstable state and a second unstable state, comprising:
 a first memristor; and
 a second memristor coupled to the first memristor, wherein a first period of time in the first unstable state is determined by a first transition time of the first memristor from a first resistance value to a second resistance value, and
 wherein a second period of time in the second unstable state is determined by a second transition time of the second memristor from a third resistance value to a fourth resistance value.

34. The signal-processing device of claim 33, wherein the device switches between the two states recurrently.

35. The signal-processing device of 33, wherein the first memristor has a positive terminal and a negative terminal and the second memristor has a positive terminal and a negative terminal with the negative terminal of the second memristor is coupled to the positive terminal of the first memristor and the negative terminal of the first memristor is coupled to the positive terminal of the second memristor.

36. The signal-processing device of 33, wherein the first resistance value is the maximum resistance of the first memristor, the second resistance value is the minimum resistance of the first memristor, the third resistance value is the maximum resistance of the second memristor, and the fourth resistance is the minimum resistance value of the second memristor.

37. The signal-processing device of claim 33, wherein the first period of time in the first unstable state is inversely proportional to a first voltage and the second period of time in the second unstable state is inversely proportional to a second voltage.

38. The signal-processing device of claim 37, wherein the first and second voltages are substantially equal in magnitude and of opposite sign producing an symmetric output signal the frequency of which is proportional to the common magnitude of the two voltages.

39. A method for operating a signal-processing device, comprising:
 applying an input signal to an arrangement of memristors; and
 causing memristance of the device, after an initial transitional period, to be predominantly at a first level if frequency of the input signal of the device is less than a first frequency and predominantly at a second level if the frequency of the input signal is greater than a second frequency.

40. The method of claim 39, wherein the arrangement of memristors comprises: a first memristor having a positive terminal and a negative terminal; and
 a second memristor having a positive terminal and a negative terminal with the negative terminal of the second memristor being coupled to the positive terminal of the first memristor, wherein the negative terminal of the first memristor is coupled to the positive terminal of the second memristor.

* * * * *